United States Patent
Hsieh et al.

(10) Patent No.: US 11,508,695 B2
(45) Date of Patent: *Nov. 22, 2022

(54) REDISTRIBUTION LAYERS IN SEMICONDUCTOR PACKAGES AND METHODS OF FORMING SAME

(71) Applicant: Taiwan Semiconductor Manufacturing Co., Ltd., Hsinchu (TW)

(72) Inventors: Cheng-Hsien Hsieh, Kaohsiung (TW); Li-Han Hsu, Hsinchu (TW); Wei-Cheng Wu, Hsinchu (TW); Hsien-Wei Chen, Hsinchu (TW); Der-Chyang Yeh, Hsinchu (TW); Chi-Hsi Wu, Hsinchu (TW); Chen-Hua Yu, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/195,903

(22) Filed: Mar. 9, 2021

(65) Prior Publication Data
US 2021/0193618 A1    Jun. 24, 2021

Related U.S. Application Data

(63) Continuation of application No. 16/661,636, filed on Oct. 23, 2019, now Pat. No. 10,950,577, which is a
(Continued)

(51) Int. Cl.
*H01L 25/065* (2006.01)
*H01L 23/538* (2006.01)
(Continued)

(52) U.S. Cl.
CPC .......... *H01L 25/0655* (2013.01); *H01L 21/56* (2013.01); *H01L 23/3107* (2013.01);
(Continued)

(58) Field of Classification Search
CPC . H01L 23/5386; H01L 23/5389; H01L 24/19; H01L 25/50; H01L 21/568;
(Continued)

(56) References Cited

U.S. PATENT DOCUMENTS 5,398,165 A    3/1995  Niinou
6,614,104 B2   9/2003  Farnworth et al.
(Continued)

FOREIGN PATENT DOCUMENTS

KR    20070073184 A    7/2007
KR    20090006357 A    1/2009
(Continued)

*Primary Examiner* — Fernando L Toledo
*Assistant Examiner* — Neil R Prasad
(74) *Attorney, Agent, or Firm* — Slater Matsil, LLP

(57) ABSTRACT

An embodiment package includes a first integrated circuit die, an encapsulant around the first integrated circuit die, and a conductive line electrically connecting a first conductive via to a second conductive via. The conductive line includes a first segment over the first integrated circuit die and having a first lengthwise dimension extending in a first direction and a second segment having a second lengthwise dimension extending in a second direction different than the first direction. The second segment extends over a boundary between the first integrated circuit die and the encapsulant.

20 Claims, 21 Drawing Sheets

Related U.S. Application Data continuation of application No. 15/682,261, filed on Aug. 21, 2017, now Pat. No. 10,475,768, which is a continuation of application No. 15/261,202, filed on Sep. 9, 2016, now Pat. No. 9,741,690.

(51) Int. Cl.
*H01L 25/00* (2006.01)
*H01L 25/10* (2006.01)
*H01L 23/00* (2006.01)
*H01L 21/56* (2006.01)
*H01L 23/31* (2006.01)
*H01L 23/498* (2006.01)

(52) U.S. Cl.
CPC ...... *H01L 23/5384* (2013.01); *H01L 23/5386* (2013.01); *H01L 23/5389* (2013.01); *H01L 24/19* (2013.01); *H01L 24/20* (2013.01); *H01L 25/0652* (2013.01); *H01L 25/105* (2013.01); *H01L 25/50* (2013.01); *H01L 21/561* (2013.01); *H01L 21/568* (2013.01); *H01L 23/3128* (2013.01); *H01L 23/49811* (2013.01); *H01L 23/5385* (2013.01); *H01L 25/0657* (2013.01); *H01L 2224/04105* (2013.01); *H01L 2224/12105* (2013.01); *H01L 2224/19* (2013.01); *H01L 2224/24137* (2013.01); *H01L 2224/32145* (2013.01); *H01L 2224/32225* (2013.01); *H01L 2224/48091* (2013.01); *H01L 2224/48227* (2013.01); *H01L 2224/73267* (2013.01); *H01L 2224/92244* (2013.01); *H01L 2224/97* (2013.01); *H01L 2225/0651* (2013.01); *H01L 2225/0652* (2013.01); *H01L 2225/06548* (2013.01); *H01L 2225/06568* (2013.01); *H01L 2225/1035* (2013.01); *H01L 2225/1041* (2013.01); *H01L 2225/1058* (2013.01); *H01L 2924/15311* (2013.01); *H01L 2924/3512* (2013.01)

(58) Field of Classification Search
CPC ....... H01L 23/3128; H01L 2224/32225; H01L 2224/48091; H01L 2924/15311
See application file for complete search history.

(56) References Cited

U.S. PATENT DOCUMENTS

| | | | |
|---|---|---|---|
| 8,071,428 B2 | 12/2011 | Pohl et al. | |
| 8,208,268 B2 | 6/2012 | Kajiki et al. | |
| 8,361,842 B2 | 1/2013 | Yu et al. | |
| 8,426,252 B2 | 4/2013 | Chung et al. | |
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 8,884,422 B2 | 11/2014 | Goh et al. | |
| 9,048,222 B2 | 6/2015 | Hung et al. | |
| 9,117,770 B2 | 8/2015 | Sakamoto | |
| 9,543,260 B2 | 1/2017 | Birner et al. | |
| 9,716,032 B2 | 7/2017 | Tang et al. | |
| 9,741,690 B1 | 8/2017 | Hsieh et al. | |
| 9,773,753 B1 | 9/2017 | Lin et al. | |
| 10,475,768 B2 | 11/2019 | Hsieh et al. | |
| 10,950,577 B2 | 3/2021 | Hsieh et al. | |
| 11,158,619 B2 | 10/2021 | Huang et al. | |
| 2005/0124093 A1* | 6/2005 | Yang | H01L 25/0657 257/E25.012 |
| 2008/0048322 A1 | 2/2008 | Baek et al. | |
| 2009/0155956 A1 | 6/2009 | Pohl et al. | |
| 2009/0206455 A1 | 8/2009 | Karper et al. | |
| 2009/0261466 A1 | 10/2009 | Pagaila et al. | |
| 2010/0001321 A1 | 1/2010 | Becker et al. | |
| 2010/0052126 A1 | 3/2010 | Hui et al. | |
| 2010/0187699 A1* | 7/2010 | Nishimura | H01L 23/522 257/691 |
| 2011/0084402 A1 | 4/2011 | Jeung et al. | |
| 2011/0291288 A1 | 12/2011 | Wu et al. | |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0307140 A1 | 11/2013 | Huang et al. | |
| 2014/0124941 A1 | 5/2014 | Sakamoto | |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2016/0218072 A1 | 7/2016 | Liao et al. | |
| 2021/0193618 A1 | 6/2021 | Hsieh et al. | |

FOREIGN PATENT DOCUMENTS

| | | |
|---|---|---|
| KR | 20130122894 A | 11/2013 |
| KR | 20150016134 A | 2/2015 |
| WO | 2013057867 A1 | 4/2013 |

\* cited by examiner

REDISTRIBUTION LAYERS IN SEMICONDUCTOR PACKAGES AND METHODS OF FORMING SAME

PRIORITY CLAIM AND CROSS-REFERENCE

This patent application is a continuation of U.S. application Ser. No. 16/661,636, filed on Oct. 23, 2019, which is a continuation of U.S. application Ser. No. 15/682,261, filed on Aug. 21, 2017, now U.S. Pat. No. 10,475,768, issued on Nov. 12, 2019, which is a continuation of U.S. patent application Ser. No. 15/261,202, filed on Sep. 9, 2016, now U.S. Pat. No. 9,741,690, issued on Aug. 22, 2017, which applications are hereby incorporated by reference herein as if reproduced in its entirety.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
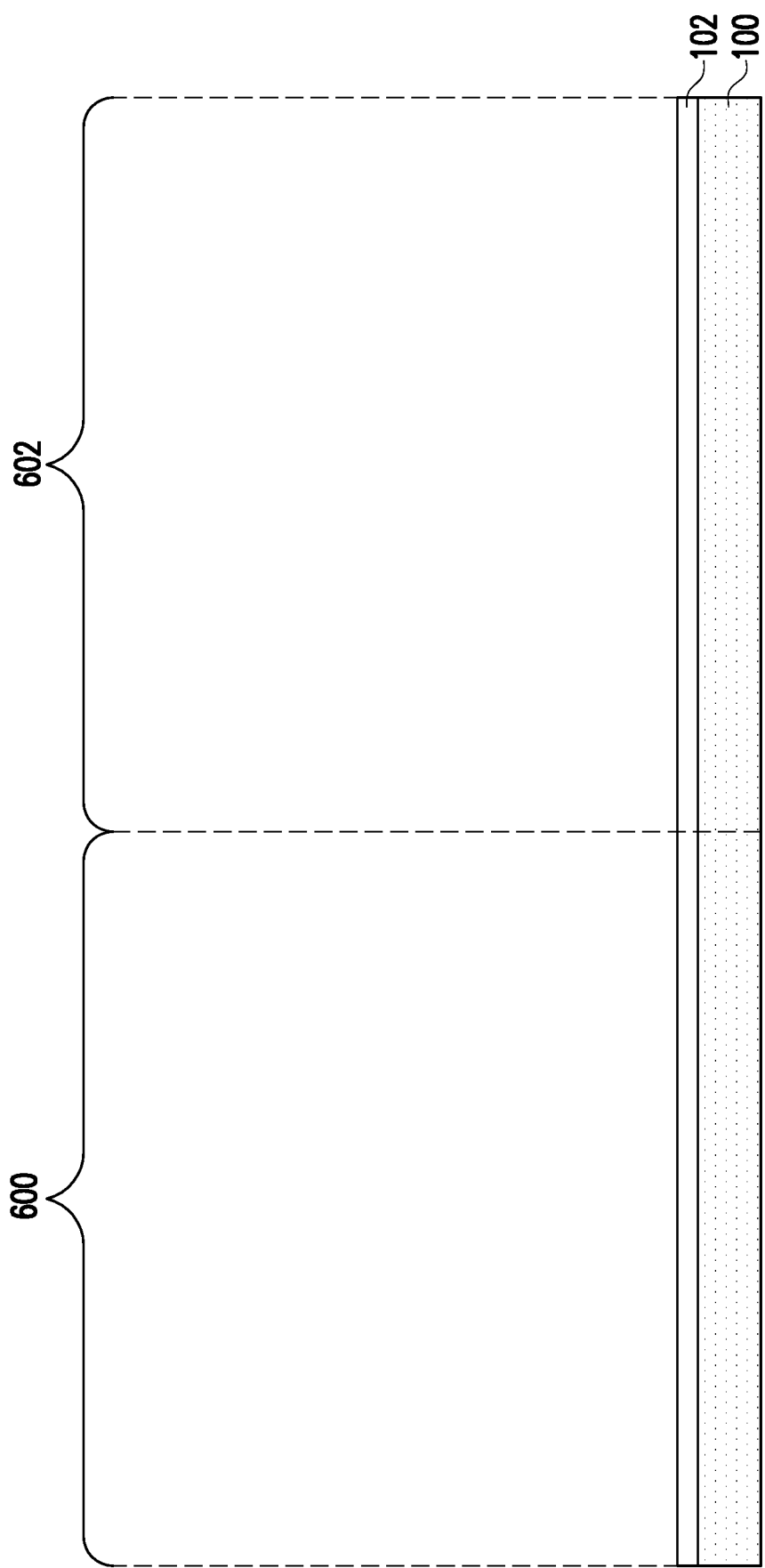
FIGS. 1 through 15 illustrate cross-sectional views of intermediate steps during a process for forming a first package structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a package structure including a redistribution layer (RDL) routing design that enables more reliability robustness at a semiconductor-encapsulant boundary (e.g. a silicon/molding compound (Si/MC) boundary). The package structures may include a fan-out package or fan-in package and may include one or more RDLs. For example, heating a package up in wafer form from room temperature to 220° Celsius (C) results in high bending stresses on the RDL at the semiconductor-encapsulant boundary due to the curvature changing because of coefficient of thermal expansion (CTE) mismatch. The semiconductor may be a die/chip. The stress of transferring across such a boundary can cause RDL cracking. Hence, in some embodiments, the RDL routing design can be configured in accordance with this CTE mismatch and be used for improved reliability robustness and fewer manufacturing defects.

Further, the teachings of this disclosure are applicable to any package structure including one or conductive layers that traverse over different materials that have different CTE. Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the component may be sufficient to convey aspects of the embodiment. Further, method embodiments discussed herein may be discussed as being performed in a particular order; however, other method embodiments may be performed in any logical order.

FIGS. 1 through 15 illustrate cross-sectional views of intermediate steps during a process for forming a first package structure in accordance with some embodiments. FIG. 1 illustrates a carrier substrate 100 and a release layer 102 formed on the carrier substrate 100. A first package region 600 and a second package region 602 for the formation of a first package and a second package, respectively, are illustrated.

The carrier substrate 100 may be a glass carrier substrate, a ceramic carrier substrate, or the like. The carrier substrate 100 may be a wafer, such that multiple packages can be formed on the carrier substrate 100 simultaneously. The release layer 102 may be formed of a polymer-based material, which may be removed along with the carrier substrate 100 from the overlying structures that will be formed in subsequent steps. In some embodiments, the release layer 102 is an epoxy-based thermal-release material, which loses its adhesive property when heated, such as a light-to-heat-conversion (LTHC) release coating. In other embodiments, the release layer 102 may be an ultra-violet (UV) glue, which loses its adhesive property when exposed to UV lights. The release layer 102 may be dispensed as a liquid and cured, may be a laminate film laminated onto the carrier substrate 100, or may be the like. The top surface of the release layer 102 may be leveled and may have a high degree of coplanarity.

Figure 2:
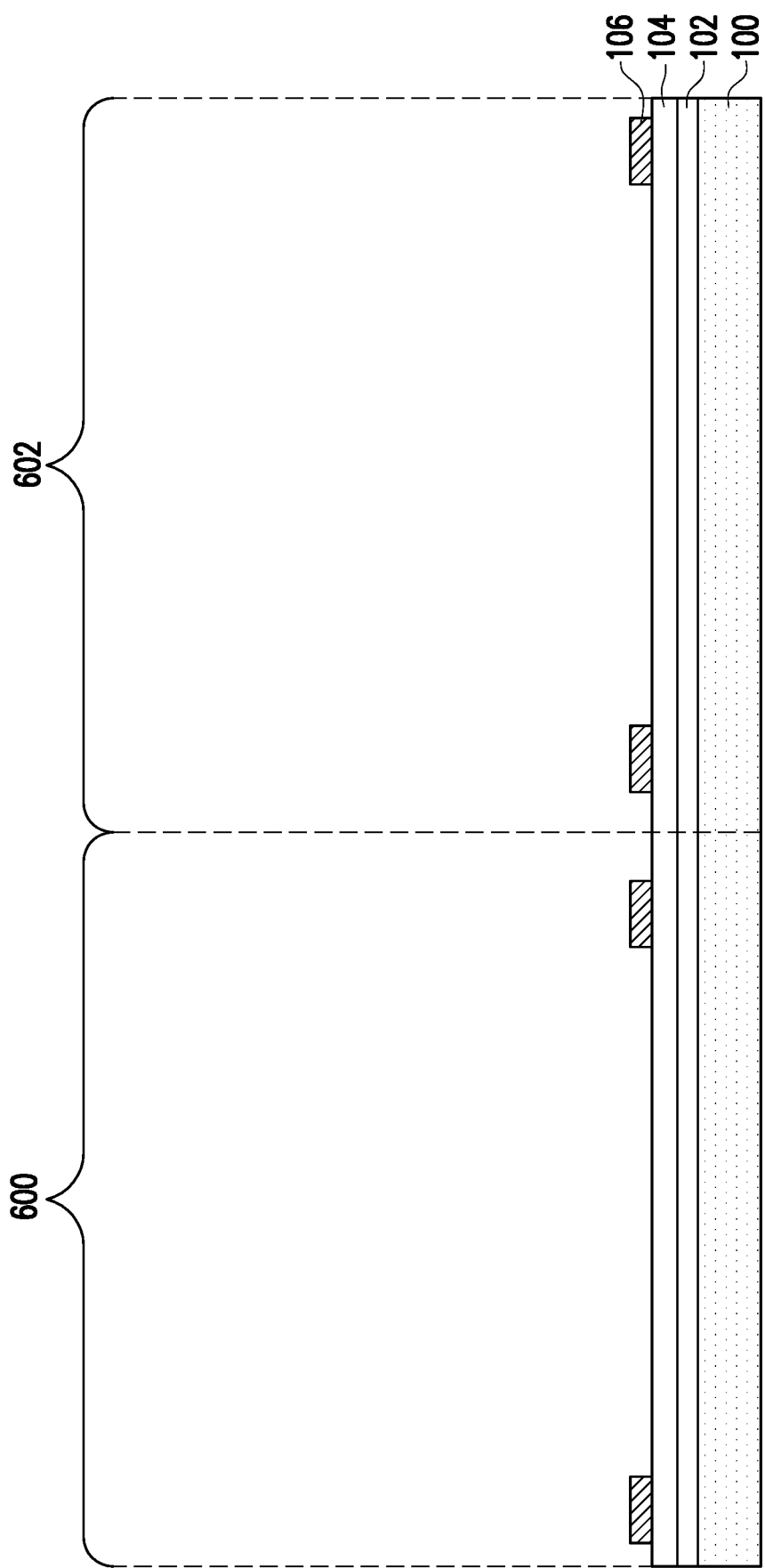

In FIG. 2, a dielectric layer 104 and a metallization pattern 106 are formed. As illustrated in FIG. 2, a dielectric layer 104 is formed on the release layer 102. The bottom surface of the dielectric layer 104 may be in contact with the top surface of the release layer 102. In some embodiments, the dielectric layer 104 is formed of a polymer, such as polybenzoxazole (PBO), polyimide, benzocyclobutene (BCB), or the like. In other embodiments, the dielectric layer 104 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 104 may be formed by any acceptable deposition process, such as spin coating, chemical vapor deposition (CVD), laminating, the like, or a combination thereof.

The metallization pattern 106 is formed on the dielectric layer 104. As an example to form metallization pattern 106, a seed layer (not shown) is formed over the dielectric layer 104. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 106. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 106.

Figure 3:
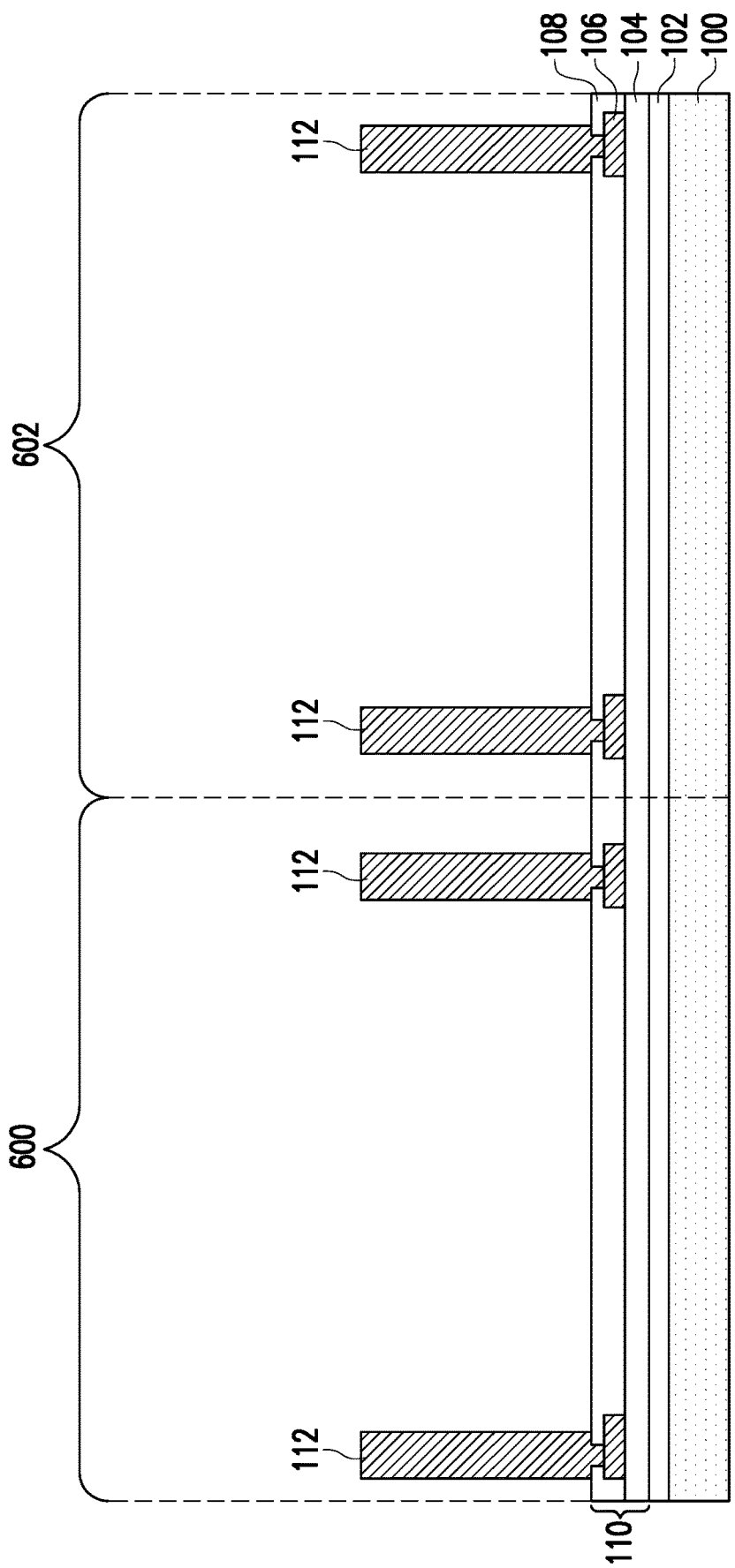

In FIG. 3, a dielectric layer 108 is formed on the metallization pattern 106 and the dielectric layer 104. In some embodiments, the dielectric layer 108 is formed of a polymer, which may be a photo-sensitive material such as PBO, polyimide, BCB, or the like, that may be patterned using a lithography mask. In other embodiments, the dielectric layer 108 is formed of a nitride such as silicon nitride; an oxide such as silicon oxide, PSG, BSG, BPSG; or the like. The dielectric layer 108 may be formed by spin coating, lamination, CVD, the like, or a combination thereof. The dielectric layer 108 is then patterned to form openings to expose portions of the metallization pattern 106. The patterning may be by an acceptable process, such as by exposing the dielectric layer 108 to light when the dielectric layer is a photo-sensitive material or by etching using, for example, an anisotropic etch.

The dielectric layers 104 and 108 and the metallization patterns 106 may be referred to as a back-side redistribution structure 110. As illustrated, the back-side redistribution structure 110 includes the two dielectric layers 104 and 108 and one metallization pattern 106. In other embodiments, the back-side redistribution structure 110 can include any number of dielectric layers, metallization patterns, and vias. One or more additional metallization pattern and dielectric layer may be formed in the back-side redistribution structure 110 by repeating the processes for forming a metallization patterns 106 and dielectric layer 108. Vias may be formed during the formation of a metallization pattern by forming the seed layer and conductive material of the metallization pattern in the opening of the underlying dielectric layer. The vias may therefore interconnect and electrically couple the various metallization patterns.

Further in FIG. 3, through vias 112 are formed. As an example to form the through vias 112, a seed layer is formed over the back-side redistribution structure 110, e.g., the dielectric layer 108 and the exposed portions of the metallization pattern 106 as illustrated. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is formed and patterned on the seed layer. The photo resist may be formed by spin coating or the like and may be exposed to light for patterning. The pattern of the photo resist corresponds to through vias. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. The photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form through vias 112.

Figure 4:
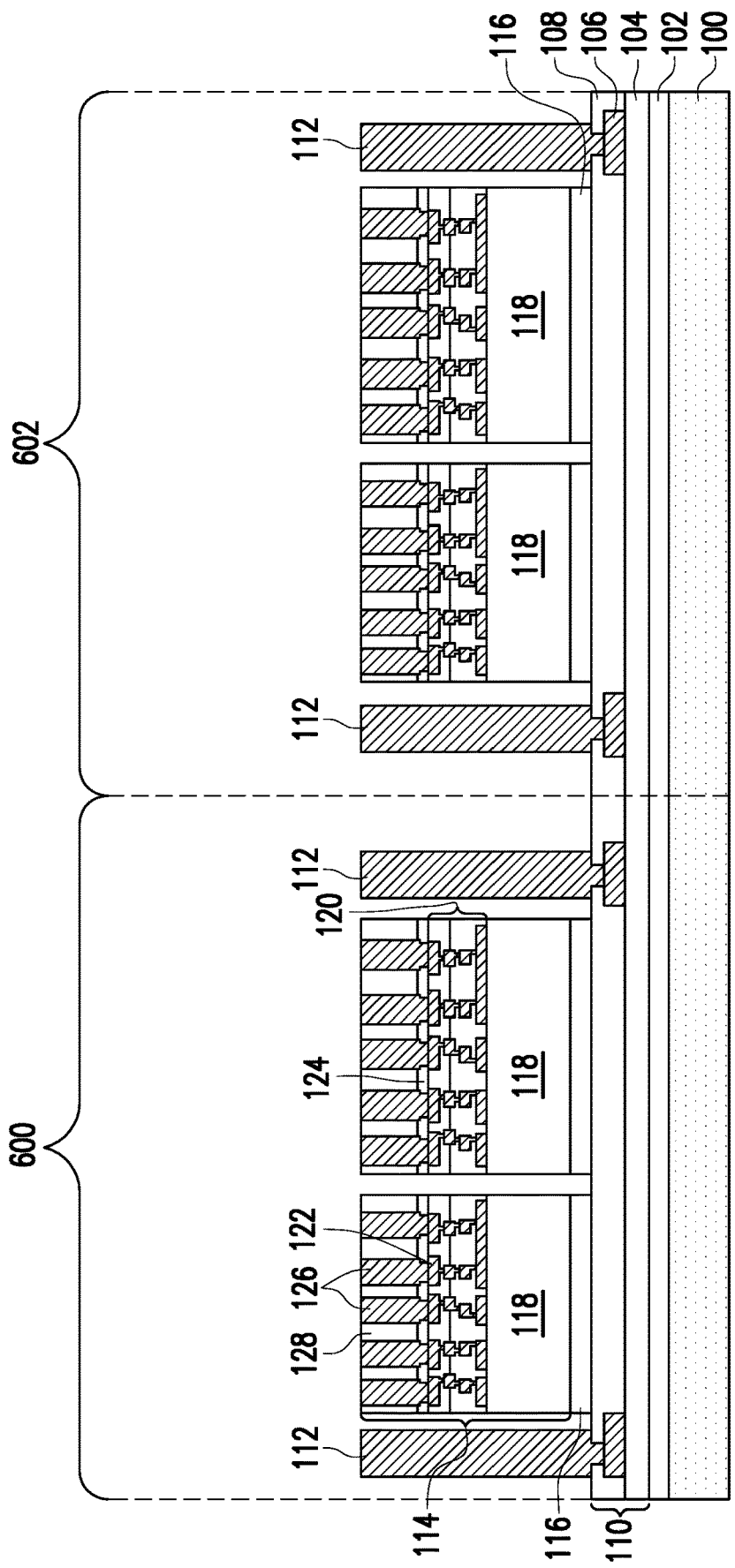

In FIG. 4, integrated circuit dies 114 are adhered to the dielectric layer 108 by an adhesive 116. As illustrated in FIG. 4, two integrated circuit dies 114 are adhered in each of the first package region 600 and the second package region 602, and in other embodiments, more or less integrated circuit dies 114 may be adhered in each region. For example, in an embodiment, only one integrated circuit die 114 may be adhered in each region. The integrated circuit dies 114 may be logic dies (e.g., central processing unit, microcontroller, etc.), memory dies (e.g., dynamic random access memory (DRAM) die, static random access memory (SRAM) die, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. Also, in some embodiments, the integrated circuit dies 114 may be different sizes (e.g., different heights and/or surface areas), and in other embodiments, the integrated circuit dies 114 may be the same size (e.g., same heights and/or surface areas).

Before being adhered to the dielectric layer 108, the integrated circuit dies 114 may be processed according to applicable manufacturing processes to form integrated circuits in the integrated circuit dies 114. For example, the integrated circuit dies 114 each include a semiconductor substrate 118, such as silicon, doped or undoped, or an active layer of a semiconductor-on-insulator (SOI) substrate. The semiconductor substrate may include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 118 and may be interconnected by interconnect structures 120 formed by, for example, metallization patterns in one or more dielectric layers on the semiconductor substrate 118 to form an integrated circuit.

The integrated circuit dies 114 further comprise pads 122, such as aluminum pads, to which external connections are made. The pads 122 are on what may be referred to as respective active sides of the integrated circuit dies 114. Passivation films 124 are on the integrated circuit dies 114 and on portions of the pads 122. Openings are through the passivation films 124 to the pads 122. Die connectors 126, such as conductive pillars (for example, comprising a metal such as copper), are in the openings through passivation films 124 and are mechanically and electrically coupled to the respective pads 122. The die connectors 126 may be formed by, for example, plating, or the like. The die connectors 126 electrically couple the respective integrated circuits of the integrate circuit dies 114.

A dielectric material 128 is on the active sides of the integrated circuit dies 114, such as on the passivation films 124 and the die connectors 126. The dielectric material 128 laterally encapsulates the die connectors 126, and the dielectric material 128 is laterally coterminous with the respective integrated circuit dies 114. The dielectric material 128 may be a polymer such as PBO, polyimide, BCB, or the like; a nitride such as silicon nitride or the like; an oxide such as silicon oxide, PSG, BSG, BPSG, or the like; the like, or a combination thereof, and may be formed, for example, by spin coating, lamination, CVD, or the like.

Adhesive 116 is on back-sides of the integrated circuit dies 114 and adheres the integrated circuit dies 114 to the back-side redistribution structure 110, such as the dielectric layer 108 in the illustration. The adhesive 116 may be any suitable adhesive, epoxy, die attach film (DAF), or the like. The adhesive 116 may be applied to a back-side of the integrated circuit dies 114, such as to a back-side of the respective semiconductor wafer or may be applied over the surface of the carrier substrate 100. The integrated circuit dies 114 may be singulated, such as by sawing or dicing, and adhered to the dielectric layer 108 by the adhesive 116 using, for example, a pick-and-place tool.

Figure 5:
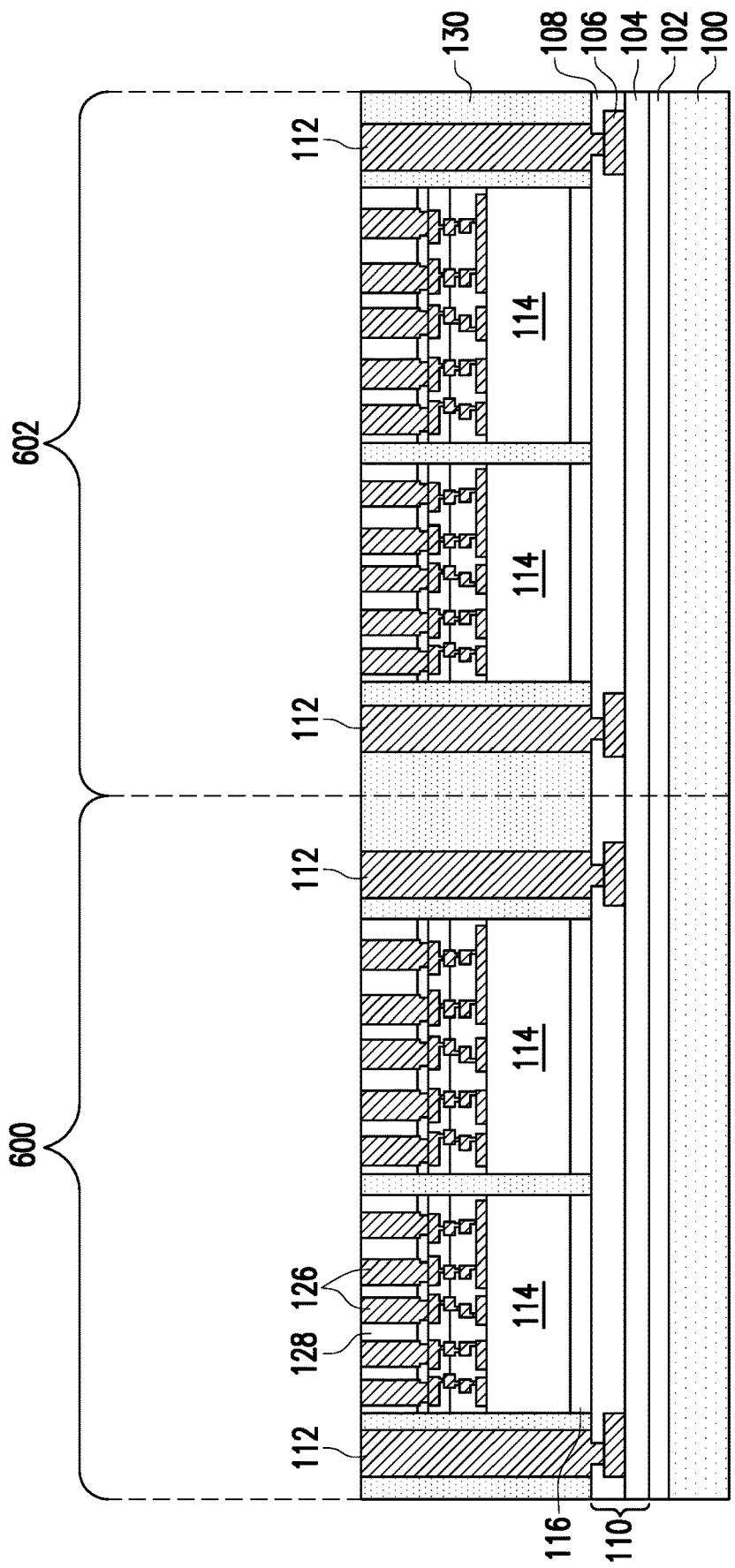

In FIG. 5, an encapsulant 130 is formed on the various components. The encapsulant 130 may be a molding compound, epoxy, or the like, and may be applied by compression molding, transfer molding, or the like. After curing, the encapsulant 130 can undergo a grinding process to expose the through vias 112 and die connectors 126. Top surfaces of the through vias 112, die connectors 126, and encapsulant 130 are coplanar after the grinding process. In some embodiments, the grinding may be omitted, for example, if through vias 112 and die connectors 126 are already exposed.

In FIGS. 6 through 15 and 19, a front-side redistribution structure 160 is formed. As will be illustrated in FIG. 19, the front-side redistribution structure 160 includes dielectric layers 132, 140, 148, and 156 and metallization patterns 138, 146, and 154.

Figure 6:
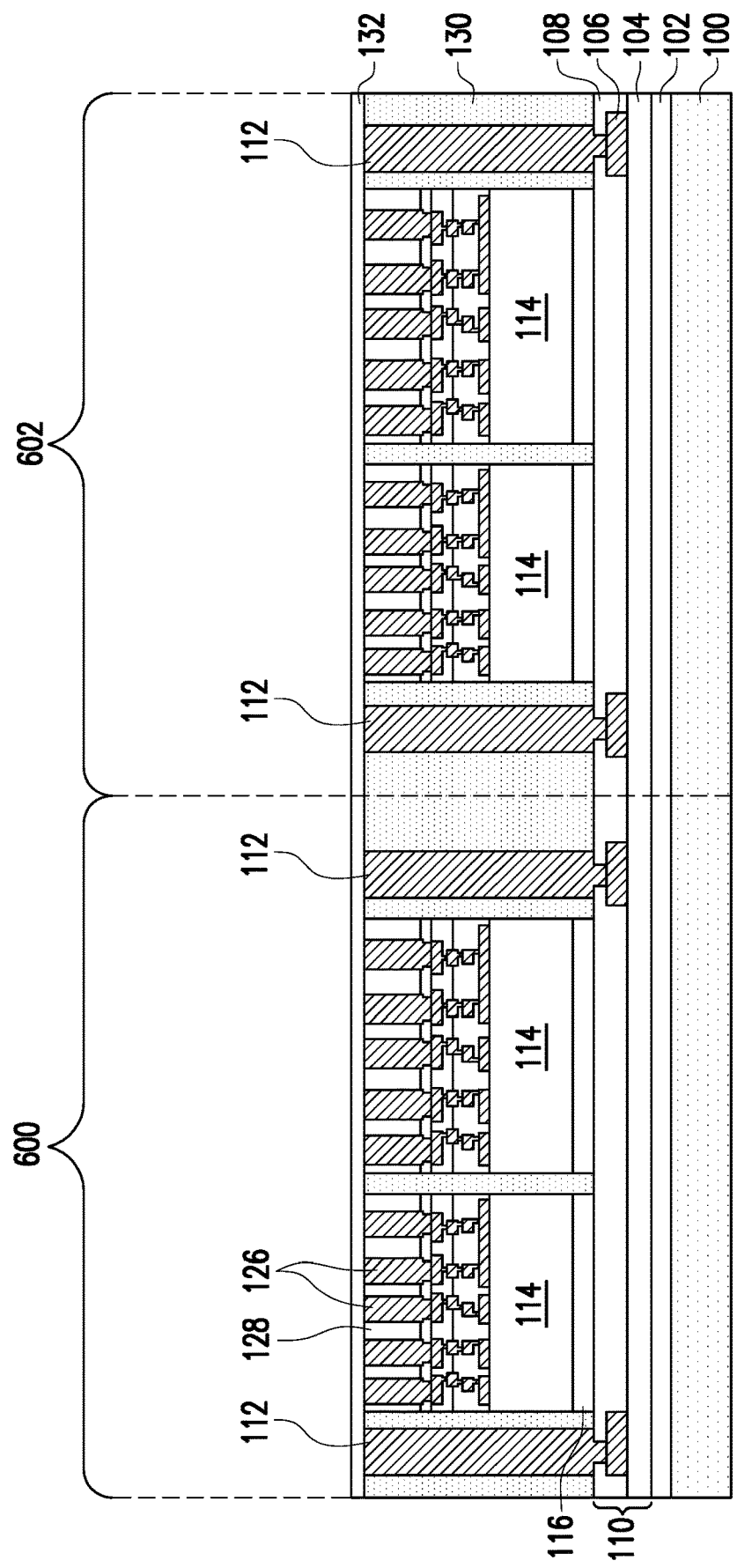

In FIG. 6, the dielectric layer 132 is deposited on the encapsulant 130, through vias 112, and die connectors 126. In some embodiments, the dielectric layer 132 is formed of a polymer, which may be a photo-sensitive material such as PBO, polyimide, BCB, or the like, that may be patterned using a lithography mask. In other embodiments, the dielectric layer 132 is formed of a nitride such as silicon nitride; an oxide such as silicon oxide, PSG, BSG, BPSG; or the like. The dielectric layer 132 may be formed by spin coating, lamination, CVD, the like, or a combination thereof.

Figure 7:
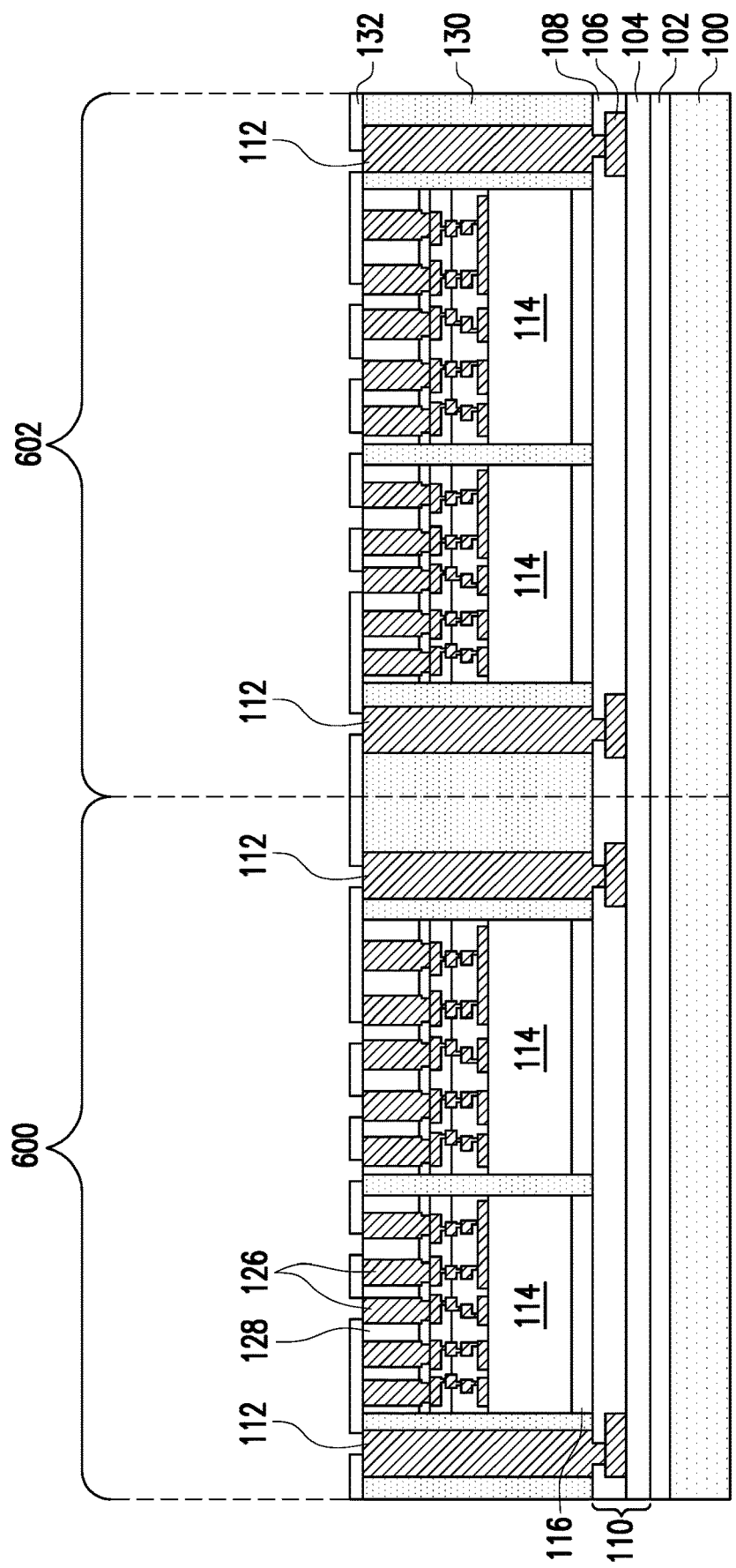

In FIG. 7, the dielectric layer 132 is then patterned. The patterning forms openings to expose portions of the through vias 112 and the die connectors 126. The patterning may be by an acceptable process, such as by exposing the dielectric layer 132 to light when the dielectric layer 132 is a photo-sensitive material or by etching using, for example, an anisotropic etch. If the dielectric layer 132 is a photo-sensitive material, the dielectric layer 132 can be developed after the exposure.

Figure 8:
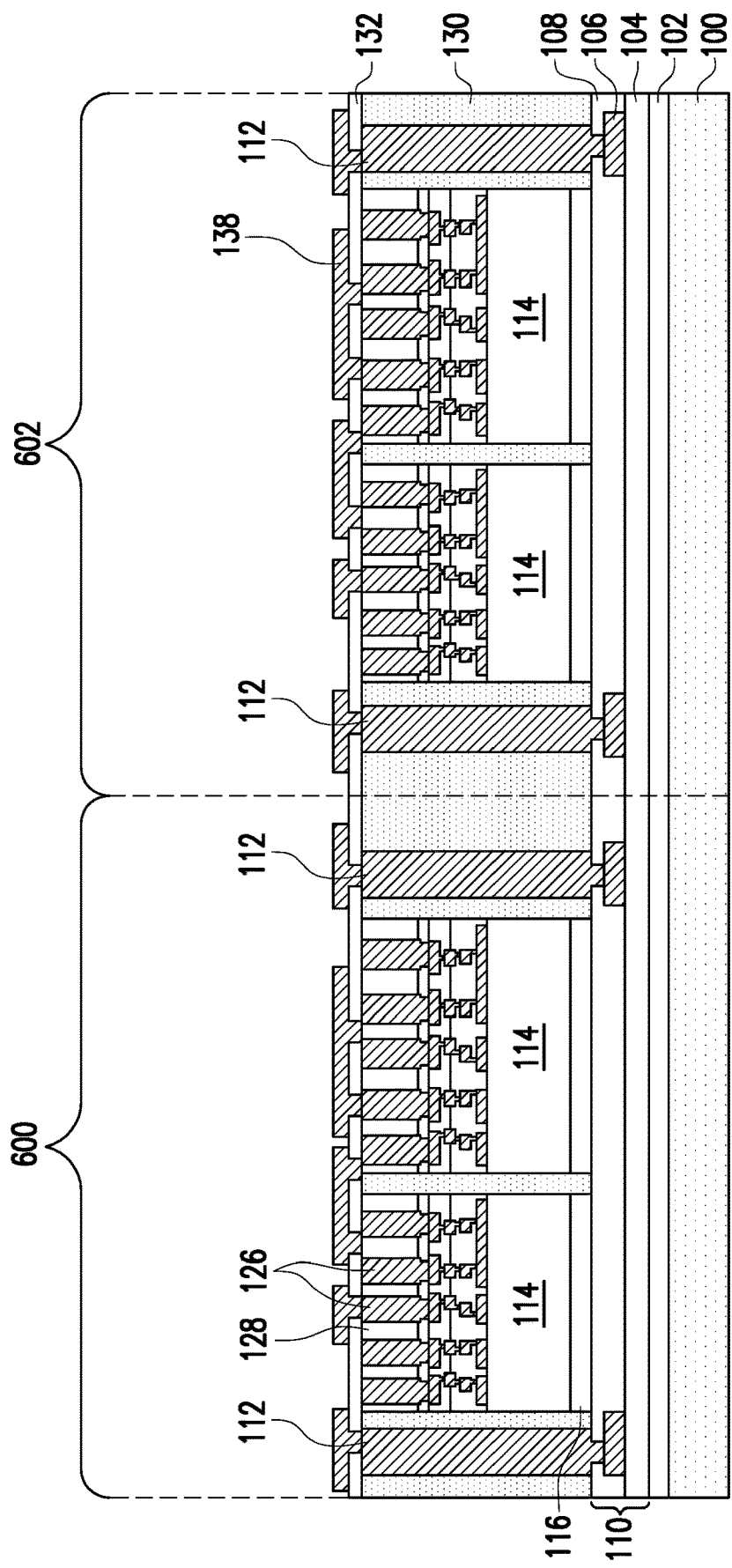

In FIG. 8, metallization pattern 138 with vias is formed on the dielectric layer 132. As an example to form metallization pattern 138, a seed layer (not shown) is formed over the dielectric layer 132 and in openings through the dielectric layer 132. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 138. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 138 and vias. The vias are formed in openings through the dielectric layer 132 to, e.g., the through vias 112 and/or the die connectors 126.

Figure 9:
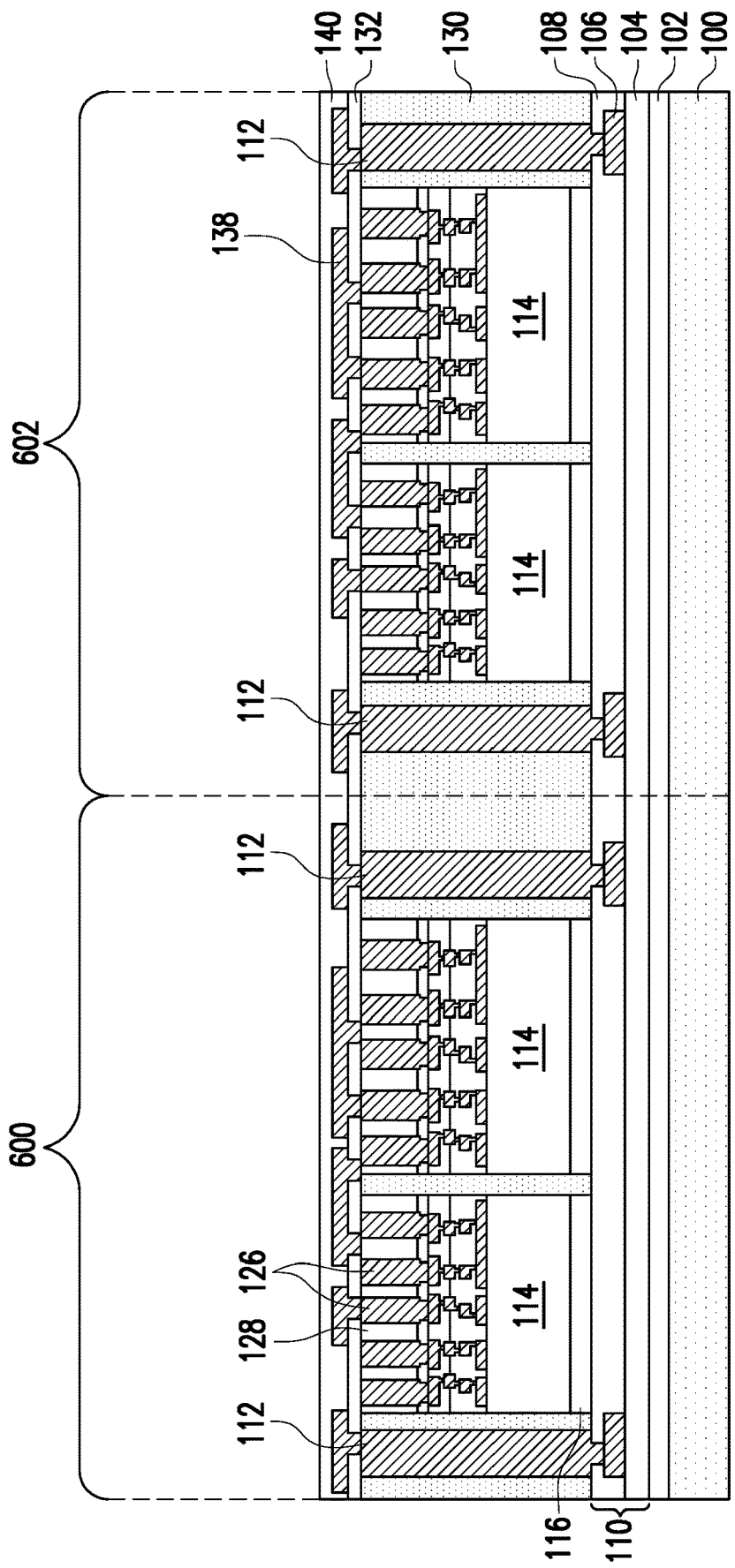

In FIG. 9, the dielectric layer 140 is deposited on the metallization pattern 138 and the dielectric layer 132. In some embodiments, the dielectric layer 140 is formed of a polymer, which may be a photo-sensitive material such as PBO, polyimide, BCB, or the like, that may be patterned using a lithography mask. In other embodiments, the dielectric layer 140 is formed of a nitride such as silicon nitride; an oxide such as silicon oxide, PSG, BSG, BPSG; or the like. The dielectric layer 140 may be formed by spin coating, lamination, CVD, the like, or a combination thereof.

Figure 10:
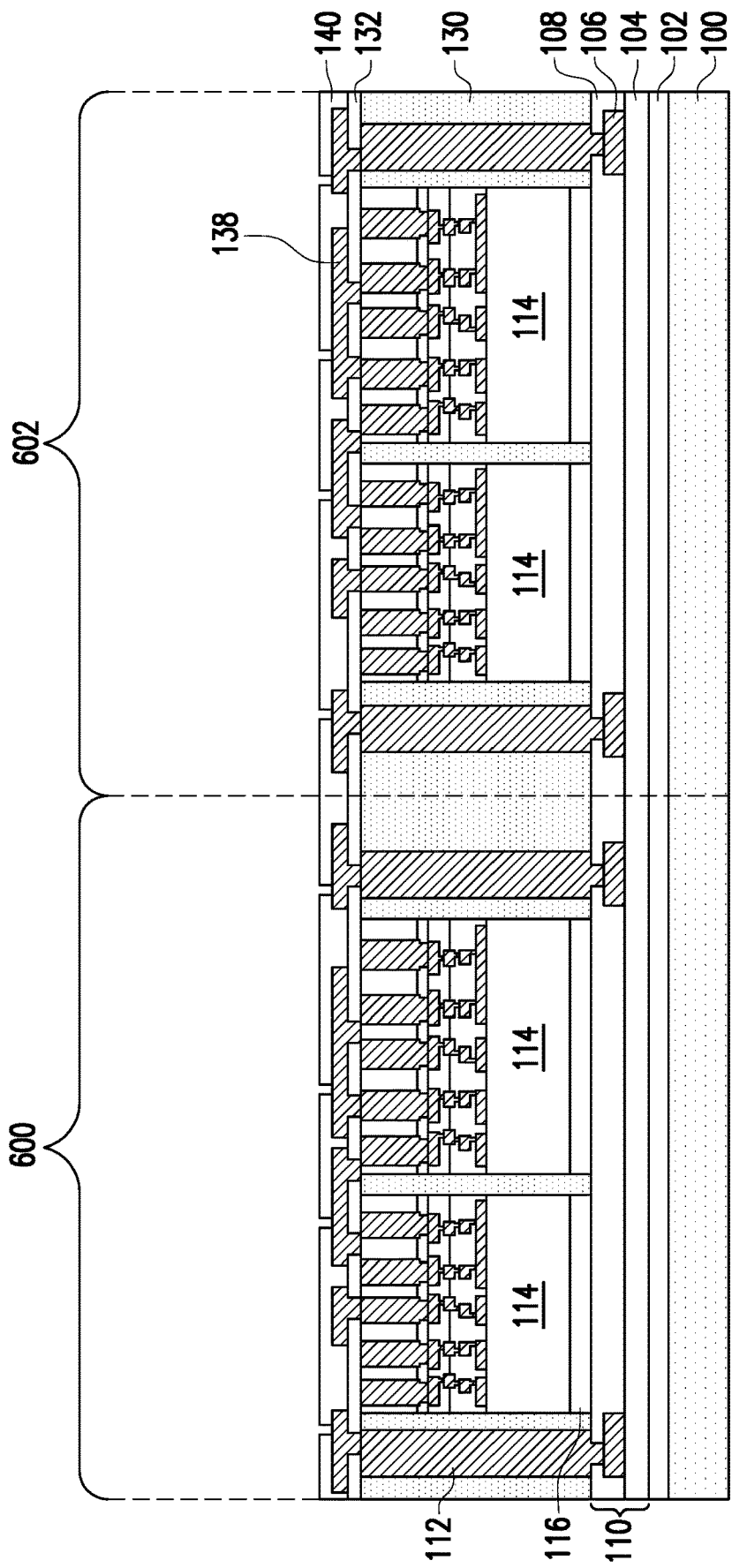

In FIG. 10, the dielectric layer 140 is then patterned. The patterning forms openings to expose portions of the metallization pattern 138. The patterning may be by an acceptable process, such as by exposing the dielectric layer 140 to light when the dielectric layer is a photo-sensitive material or by etching using, for example, an anisotropic etch. If the dielectric layer 140 is a photo-sensitive material, the dielectric layer 140 can be developed after the exposure.

Figure 11:
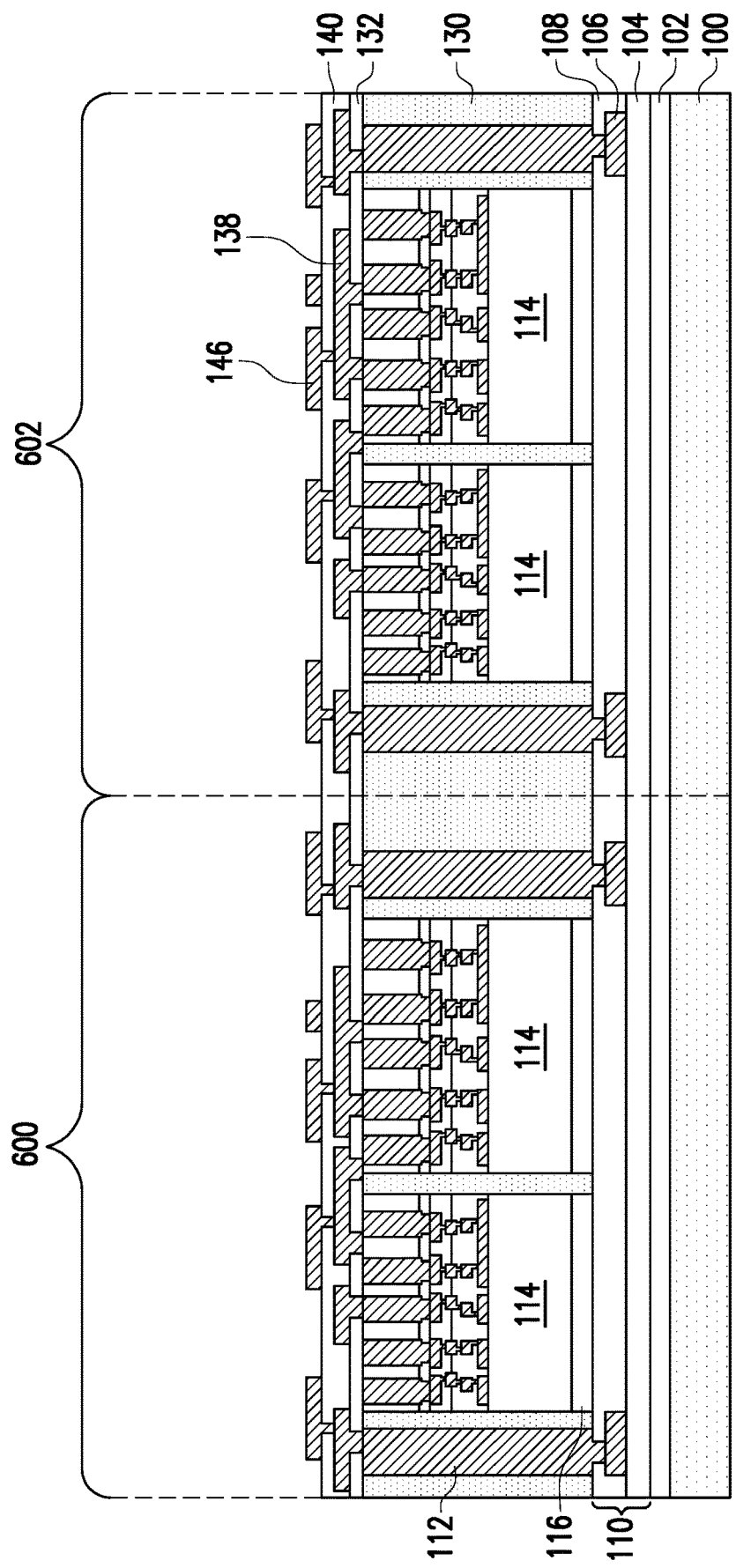

In FIG. 11, metallization pattern 146 with vias is formed on the dielectric layer 140. As an example to form metallization pattern 146, a seed layer (not shown) is formed over the dielectric layer 140 and in openings through the dielectric layer 140. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 146. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 146 and vias. The vias are formed in openings through the dielectric layer 140 to, e.g., portions of the metallization pattern 138.

Figure 12:
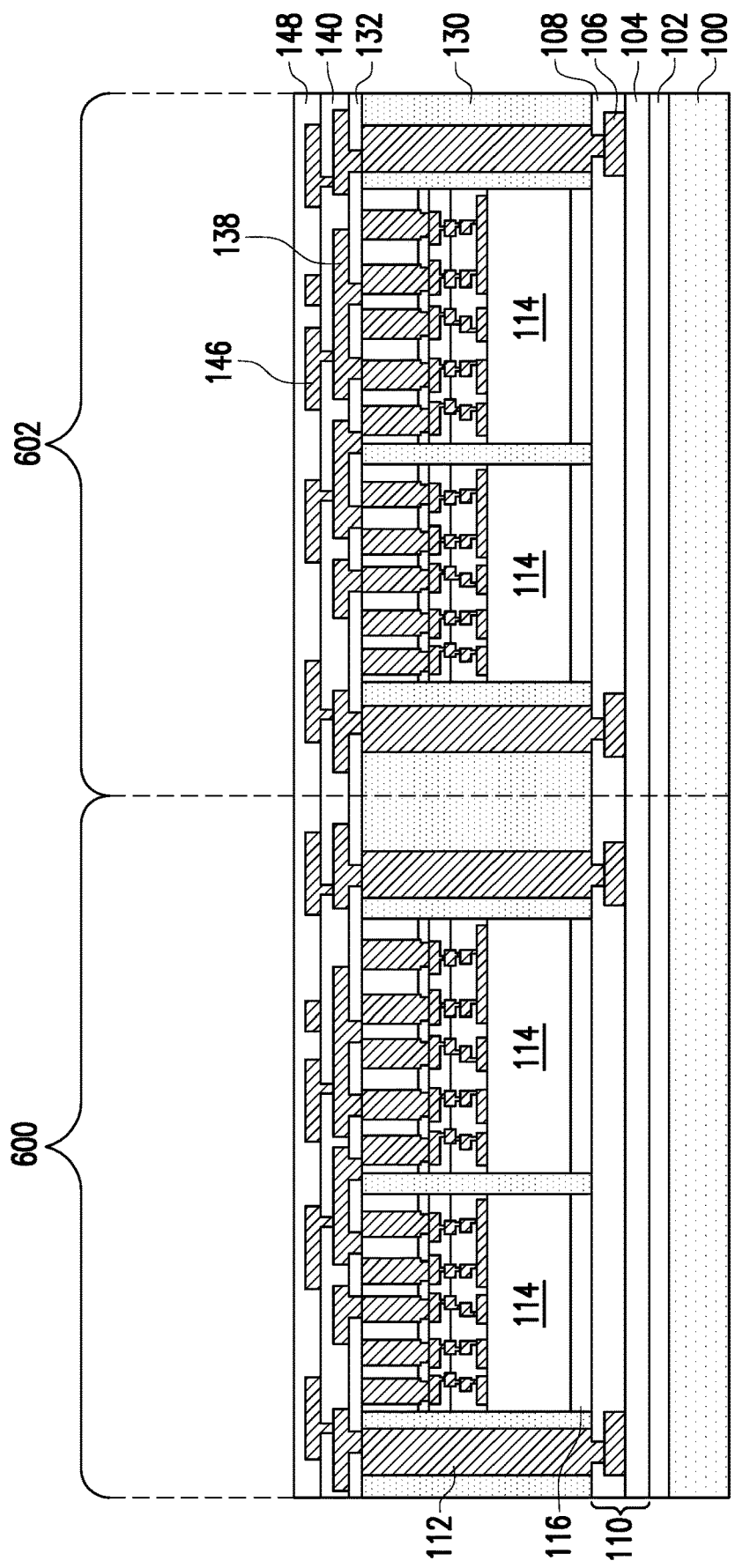

In FIG. 12, the dielectric layer 148 is deposited on the metallization pattern 146 and the dielectric layer 140. In some embodiments, the dielectric layer 148 is formed of a polymer, which may be a photo-sensitive material such as PBO, polyimide, BCB, or the like, that may be patterned using a lithography mask. In other embodiments, the dielectric layer 148 is formed of a nitride such as silicon nitride; an oxide such as silicon oxide, PSG, BSG, BPSG; or the like. The dielectric layer 148 may be formed by spin coating, lamination, CVD, the like, or a combination thereof.

Figure 13:
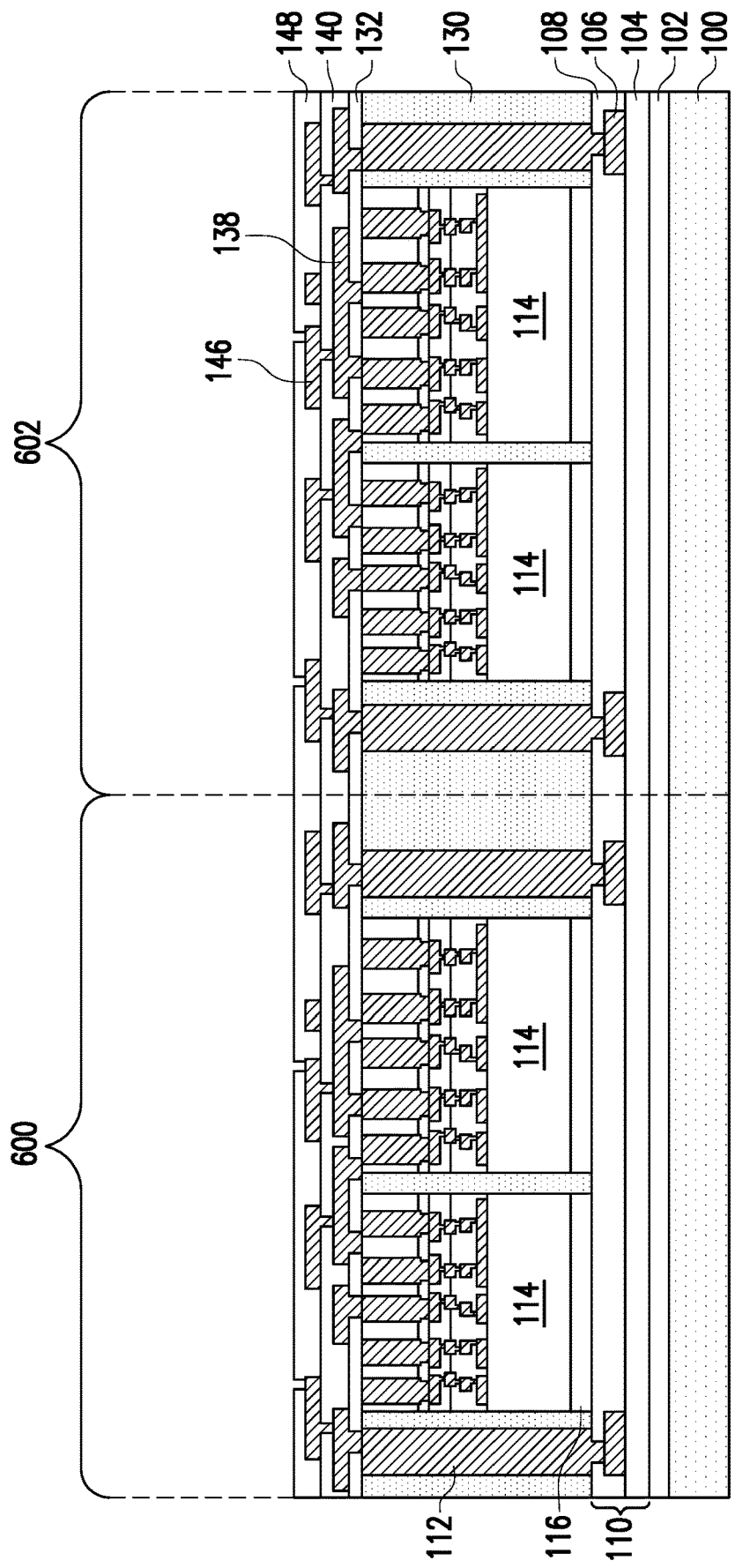

In FIG. 13, the dielectric layer 148 is then patterned. The patterning forms openings to expose portions of the metallization pattern 146. The patterning may be by an acceptable process, such as by exposing the dielectric layer 148 to light when the dielectric layer is a photo-sensitive material or by etching using, for example, an anisotropic etch. If the dielectric layer 148 is a photo-sensitive material, the dielectric layer 148 can be developed after the exposure.

Figure 14:
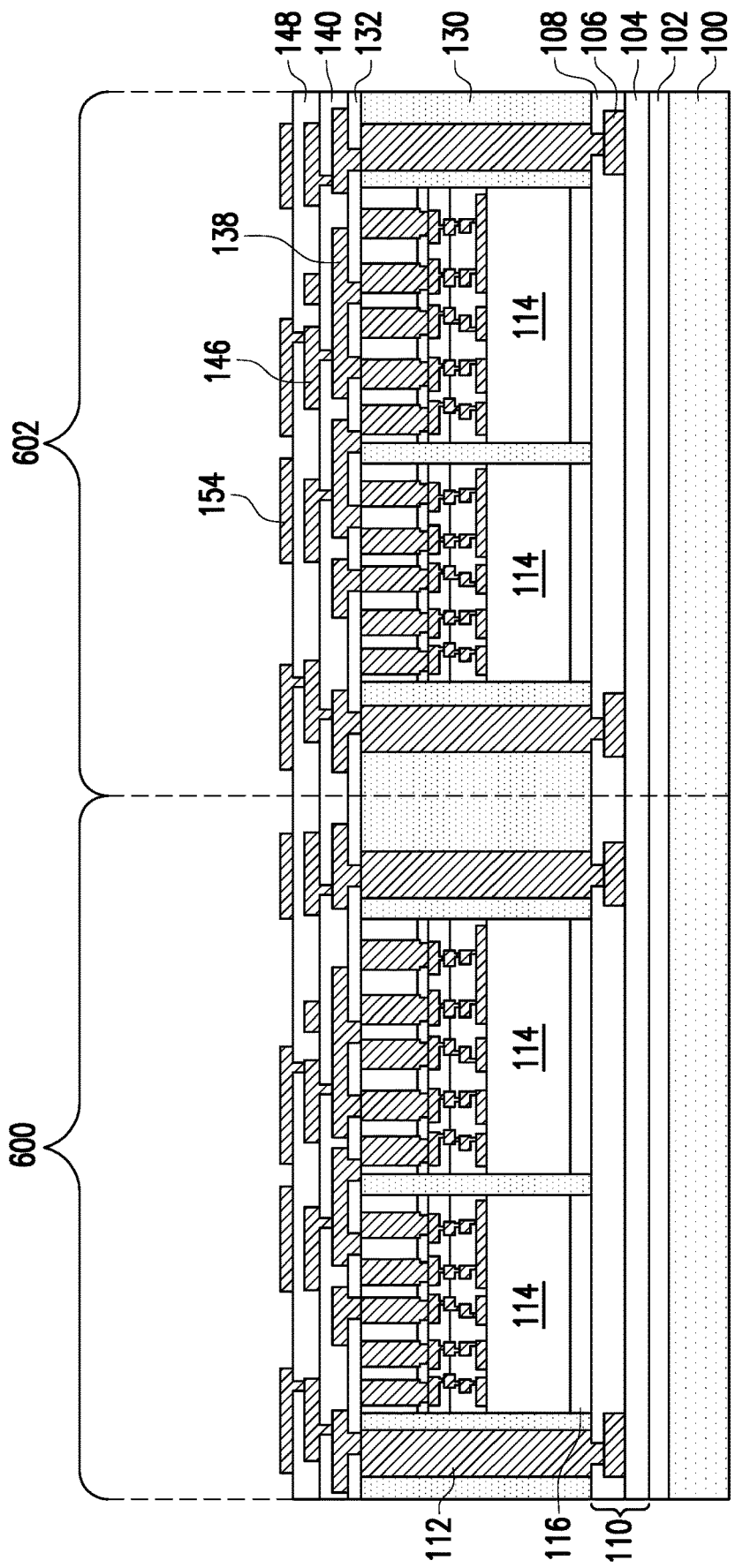

In FIG. 14, metallization pattern 154 with vias is formed on the dielectric layer 148. As an example to form metallization pattern 154, a seed layer (not shown) is formed over the dielectric layer 148 and in openings through the dielectric layer 148. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 154. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 154 and vias. The vias are formed in openings through the dielectric layer 148 to, e.g., portions of the metallization pattern 146.

Figure 15:
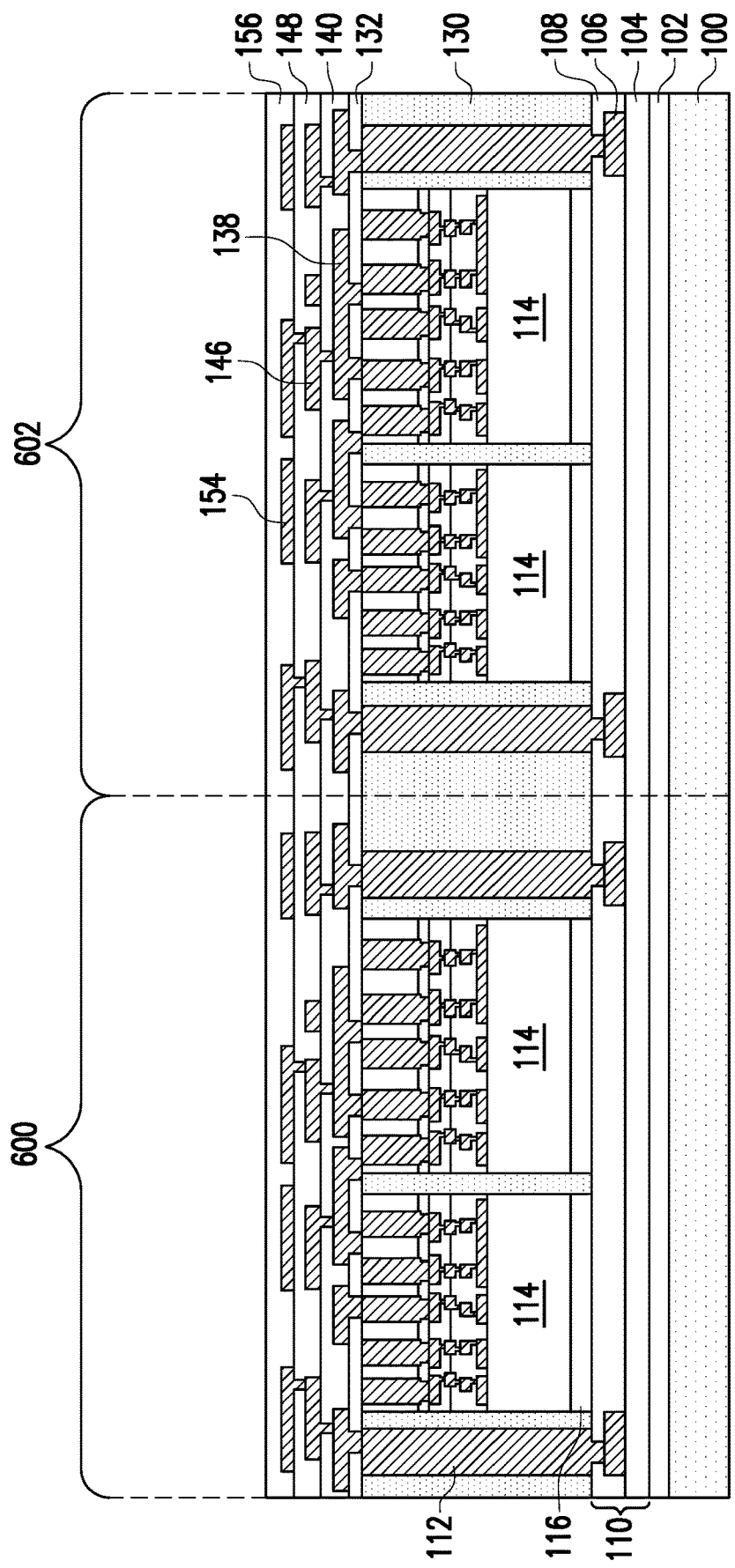

In FIG. 15, the dielectric layer 156 is deposited on the metallization pattern 154 and the dielectric layer 148. In some embodiments, the dielectric layer 156 is formed of a polymer, which may be a photo-sensitive material such as PBO, polyimide, BCB, or the like, that may be patterned using a lithography mask. In other embodiments, the dielectric layer 156 is formed of a nitride such as silicon nitride; an oxide such as silicon oxide, PSG, BSG, BPSG; or the like. The dielectric layer 156 may be formed by spin coating, lamination, CVD, the like, or a combination thereof.

Figure 16:
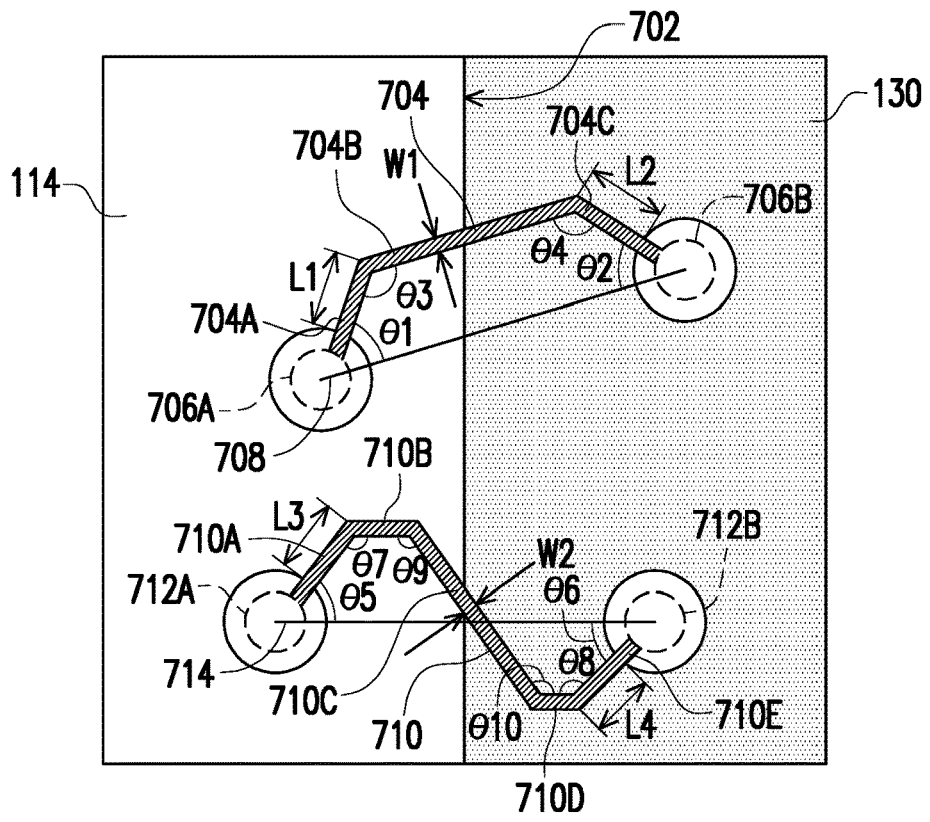
FIGS. 16 through 17 illustrate plan views of a conductive layer routing in accordance with some embodiments.
Figure 17:
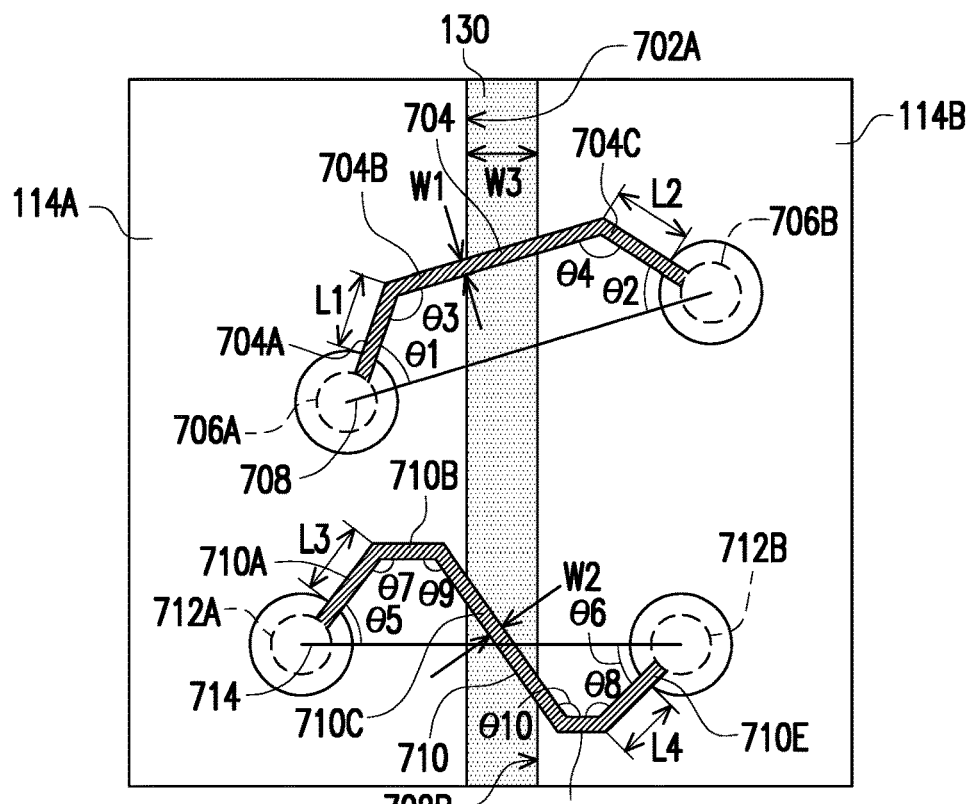

FIGS. 16 and 17 illustrate simplified plan views of RDL routing in accordance with some embodiments. FIG. 16 illustrates a simplified plan view of one of the first package structures of FIG. 15. The illustrated plan view includes a boundary 702 between one of the integrated circuit dies 114 and the encapsulant 130. Conductive lines 704 and 710 of the overlying metallization patterns 154/146/138 (RDL patterns) are shown. Conductive vias 706A, 706B, 712A and 712B (e.g., die connectors 126, through vias 112, and/or vias of the metallization patterns 154/146/138) are also illustrated in ghost for reference. Dielectric layers 132, 140, 148, and 156 are not shown. Various features of the plan view illustrated by FIG. 16 are illustrated in a single layer for simplicity only. In various embodiments, features in FIG. 16 may be disposed in different layers according to the cross-sectional view of FIG. 15. Furthermore, the conductive lines 704 and 710 may be disposed in a same metallization pattern or in different metallization patterns within a package. For example, the conductive line 704 may be disposed within a same layer, above, or below the conductive line 710.

As illustrated by FIG. 16, the conductive lines 704 and 710 extend over the boundary 702 between the integrated circuit die 114 and the encapsulant 130. Conductive lines 704 and 710 may electrically and mechanically connect conductive vias 706A and 712A over the integrated circuit die 114 to conductive vias 706B and 712B in and/or over the encapsulant 130. As discussed above, due to CTE mismatch between the materials of the integrated circuit die 114 and the encapsulant 130, curvatures of the device package may occur at the boundary 702, which applies stress to the conductive lines 704 and 710 at the location of the boundary 702. It has been observed that this stress to the conductive lines 704 and 710 may be mitigated by changing a lengthwise direction of the conductive lines 704 and 710 between the respective vias 706A/706B/712A/712B and the boundary 702. For example, each of the conductive lines 704 and 710 include at least one bend disposed over the integrated circuit die 114 and disposed between the respective vias 706A/712A and the boundary 702. Each of the conductive lines 704 and 710 may further include at least a bend disposed over the encapsulant 130 and disposed between the respective vias 706B/712B and the boundary 702. It has been observed that by configuring conductive lines in accordance with the CTE mismatch between the integrated circuit die 114 and the encapsulant 130 in the manner described herein, stress to conductive lines extending over a die/molding compound boundary can be reduced by 50% or more. By reducing stress applied to the conductive lines, cracking and/or other manufacturing defects in the metallization patterns of a RDL can be reduced.

For example, in FIG. 16, the conductive line 704 includes three conductive line segments 704A, 704B, and 704C having lengthwise dimensions running in different directions in the plan view of FIG. 16. A widthwise dimension W1 of the conductive line 704 may be about 5 µm to about 34 µm. In other embodiments, the widthwise dimension W1 of the conductive line 704 may be a different value.

The conductive line segment 704A extends from a first conductive via 706A (e.g., over the integrated circuit die 114) to the conductive line segment 704B. The conductive line segment 704B extends from the conductive line segment 704A to the conductive line segment 704C. The conductive line segment 704C extends from the conductive line segment 704B to a second conductive via 706B (e.g., in and/or over the encapsulant 130). In an embodiment, a lengthwise dimension L1 of the conductive line segment 704A is greater than about 15 µm, and a lengthwise dimension L2 of the conductive line segment 704C is greater than about 15 µm. The lengthwise dimensions L1 and L2 may or may not be substantially equal. In other embodiments, the lengthwise dimensions of the conductive line segments 704A and/or 705C may have a different value.

As illustrated, the conductive line segments 704A and 704C are non-parallel to a line 708 extending through respective centers of the conductive vias 706A and 706B. For example, an angle θ1 between conductive line segment 704A and line 708 may be about 30° to about 60°, and an angle θ2 between conductive line segment 704C and line 708 may be about 30° to about 60°. The angles θ1 and θ2 may or may not be substantially equal. Furthermore, the conductive line segment 704B is non-parallel to the conductive line segments 704A and 704B. For example, an angle θ3 between the conductive line segment 704A and the conductive line segment 704B may be about 120° to about 150°, and an angle θ4 between the conductive line segment 704B and the conductive line segment 704C may be about 120° to about 150°. The angles θ3 and θ4 may or may not be substantially equal. It has been observed that when the angles θ1, θ2, θ3, and/or θ4 are disposed in the above ranges, stress to the conductive line 704 may be reduced, which reduces the risk of conductive line cracking. In other embodiments, the relative angles of the respective conductive line segments 704A, 704B, and/or 704C may be different value. Furthermore, the angle between the conductive line segment 704C and the boundary 702 is purely illustrative, and conductive line segment 704C may be disposed at an angle across the boundary 702. The angle between the line 708 and the boundary 702 is also purely illustrative, and line 708 may be disposed at an angle across the boundary 702.

As described herein, conductive line 704 includes two bends, including a first bend at adjoining conductive lines segments 704A and 704B and a second bend at adjoining conductive line segments 704B and 704C. The first bend is disposed between the first conductive via 706A (e.g., over the integrated circuit die 114) and the boundary 702. The second bend is disposed between the second conductive via 706B (e.g., in and/or over the encapsulant 130) and the boundary 702. The conductive line 704 changes directions between the first conductive via 706A and the boundary 702, and the conductive line 704 also changes directions between the boundary 702 and the second conductive via 706B. In other embodiments, various conductive lines extending over the boundary 702 may include a different number of bends, such as, greater than two bends. For example, as also illustrated in FIG. 16, the conductive line 710 includes four bends and conductive line segments 710A, 710B, 710C, 710D, and 710E having lengthwise dimensions running in different directions in the plan view of FIG. 16. A widthwise dimension W2 of the conductive line 710 may be about 5 µm to about 34 µm. In other embodiments, the widthwise dimension W2 of the conductive line 710 may be a different value.

The conductive line segment 710A extends from a first conductive via 712A (e.g., in and/or over the integrated circuit die 114) to the conductive line segment 710B. The conductive line segment 710B extends from the conductive line segment 710A to the conductive line segment 710C. The conductive line segment 710C extends over the boundary 702, and the conductive line segment 710C extends from the conductive line segment 710B to the conductive line segment 710D. The conductive line segment 710D extends from the conductive line segment 710C to the conductive line segment 710E. The conductive line segment 710E extends from the conductive line segment 710D to a second conductive via 712B (e.g., in and/or over the encapsulant 130). In an embodiment, a lengthwise dimension L3 of the conductive line segment 710A is greater than about 15 µm, and a lengthwise dimension L4 of the conductive line segment 710E is greater than about 15 µm. The lengthwise dimensions L3 and L4 may or may not be substantially equal. In other embodiments, the lengthwise dimensions of the conductive line segments 710A and 710E may have a different value.

As illustrated, the conductive line segments 710A, 710C, and 710E are non-parallel to a line 714 extending through respective centers of the conductive vias 712. For example, an angle θ5 between conductive line segment 710A and line 714 may be about 30° to about 60°, and an angle θ6 between conductive line segment 710E and line 714 may be about 30° to about 60°. The angles θ1 and θ2 may or may not be substantially equal. Furthermore, the conductive line segments 710B and 710D are non-parallel to the conductive line segments 710A and 710E. For example, an angle θ7 between the conductive line segment 710A and the conductive line segment 710B may be about 120° to about 150°, and an angle θ8 between the conductive line segment 710D and the conductive line segment 710E may be about 120° to about 150°. The angles θ7 and θ8 may or may not be substantially equal. Furthermore, the conductive line segments 710B and 710D are non-parallel to the conductive line segment 710C. For example, an angle θ9 between the conductive line segment 710B and the conductive line segment 710C may be about 120° to about 150°, and an angle θ10 between the conductive line segment 710D and the conductive line segment 710C may be about 120° to about 150°. The angles θ9 and θ10 may or may not be substantially equal. It has been observed that when the angles θ5, θ6, θ7, θ8, θ9, and/or θ10 are disposed in the above ranges, stress to the conductive line 710 may be reduced, which reduces the risk of conductive line cracking. In other embodiments, the conductive line segments 710A, 710B, 710C, 710D, and/or 710E may be disposed at different angles.

At least one of the bends in the conductive line 710 is between the first conductive via 712A and the boundary 702, and at least one of the bends in conductive line 710 is between the boundary 702 and the second conductive via 712B. Furthermore, the angle between the conductive line segment 710C and the boundary 702 is purely illustrative, and conductive line segment 710C may be disposed at an angle across the boundary 702. The angle between the line 714 and the boundary 702 is also purely illustrative, and line 714 may be disposed at an angle across the boundary 702.

In FIG. 16, the conductive vias 706B and 712B are disposed over or in the encapsulant 130. In other embodiments, the conductive vias 706B and 712B may be disposed over a second integrated circuit die 114. For example, FIG. 17 illustrates two integrated circuit dies 114A and 114B encapsulated in the encapsulant 130. In an embodiment, a distance W3 between the two integrated circuit dies 114A and 114B may be about 50 μm to about 300 μm. In another embodiment, the distance W3 between the two integrated circuit dies 114A and 114B may be a different value. A first boundary 702A is shared between the first integrated circuit die 114A and the encapsulant 130, and a second boundary 702B is shared between the second integrated circuit die 114B and the encapsulant 130.

The first conductive vias 706A and 712A are disposed over a first integrated circuit die 114A, and the second conductive vias 706B and 712B are disposed over a second integrated circuit die 114B. The conductive line 704 electrically and mechanically connects the first conductive via 706A to the second conductive via 706B, and the conductive line 710 electrically and mechanically connects the first conductive via 712A to the second conductive via 712B. Furthermore, each of the conductive lines 704 and 710 may have at least one bend disposed over each of the integrated circuit dies 114A/114. For example, each of the conductive lines 704 and 710 includes at least one bend disposed over the first integrated circuit die 114A and disposed between a respective first conductive via 706A/712A and the first boundary 702A. Each of the conductive lines 704 and 710 may further include at least one bend disposed over the second integrated circuit die 114B and disposed between a respective second conductive via 706B/712B and the second boundary 702B. It has been observed than when the conductive lines 704 and 710 are formed in the configurations described herein and illustrated by FIG. 17, reductions in stress to the conductive lines 704 and 710 can be achieved. The various specifics of conductive lines 704 and 710 in FIG. 17 may be substantially similar to respective conductive lines 704 and 710 in FIG. 16 where like reference numerals indicate like elements formed using like processes (e.g., as described in FIGS. 1 through 15). Thus, additional description of the conductive lines 704 and 710 in the FIG. 17 is omitted for brevity.

In some embodiments, the above-described RDL routing design techniques are applied only to the first metallization pattern (e.g., metallization pattern 138) overlying the integrated circuit die 114 and the encapsulant 130 with the remaining metallization patterns being routed without regard to the configurations described in FIGS. 16 and 17. In some other embodiments, the above-described RDL routing design techniques are applied to all of the metallization patterns overlying the integrated circuit die 114 and the encapsulant 130 (e.g., metallization pattern 138, 146, and 154).

FIGS. 18 through 24 illustrate cross-sectional views of intermediate steps during a process for further forming a first package and for attaching other package structures to the first package in accordance with some embodiments.

Figure 18:
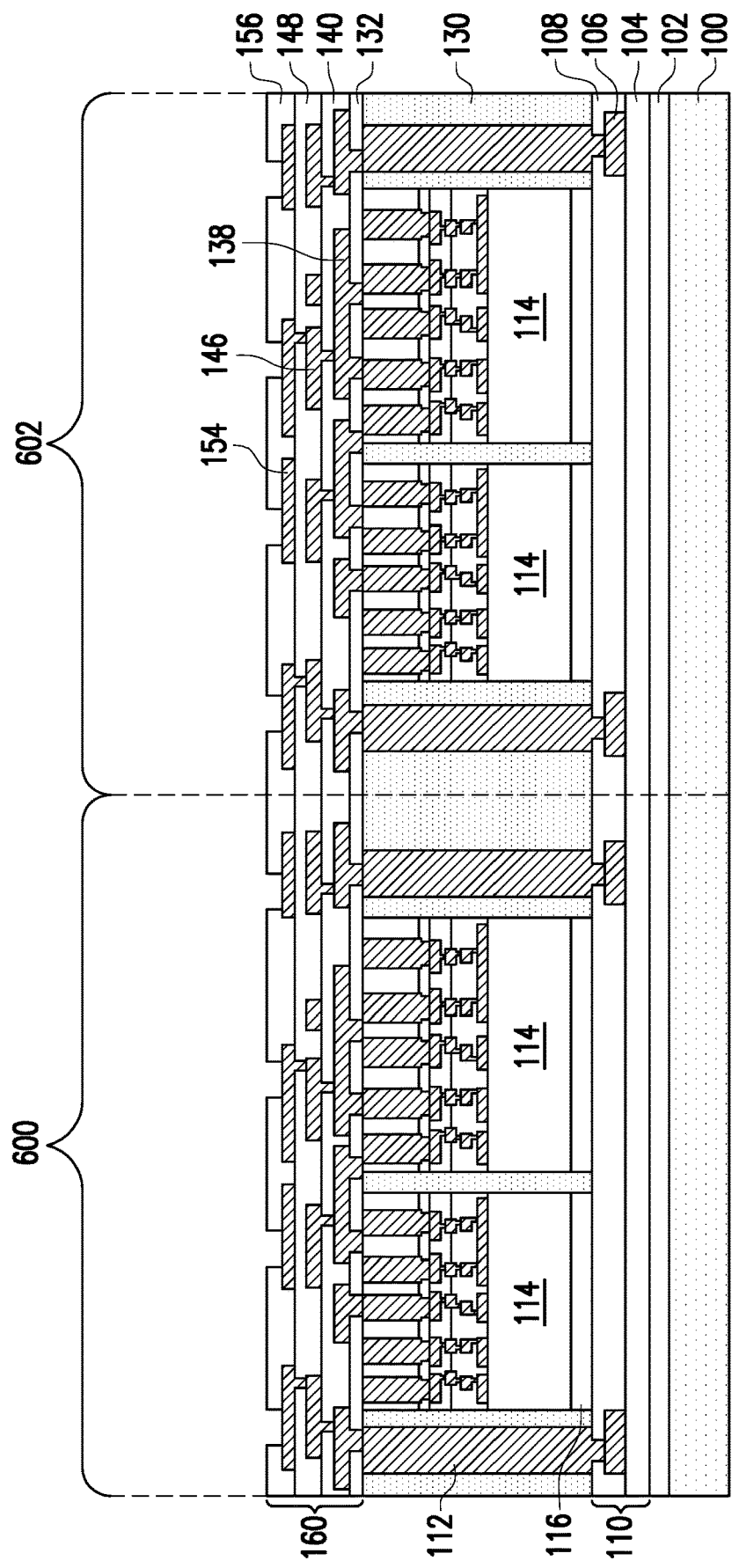
FIGS. 18 through 23 illustrate cross-sectional views of intermediate steps during a process for further forming the first package and for attaching other package structures to the first package in accordance with some embodiments.

In FIG. 18, the dielectric layer 156 is then patterned. The patterning forms openings to expose portions of the metallization pattern 154. The patterning may be by an acceptable process, such as by exposing the dielectric layer 156 to light when the dielectric layer is a photo-sensitive material or by etching using, for example, an anisotropic etch. If the dielectric layer 156 is a photo-sensitive material, the dielectric layer 156 can be developed after the exposure.

The front-side redistribution structure 160 is shown as an example. More or fewer dielectric layers and metallization patterns may be formed in the front-side redistribution structure 160. If fewer dielectric layers and metallization patterns are to be formed, steps and process discussed above may be omitted. If more dielectric layers and metallization patterns are to be formed, steps and processes discussed above may be repeated. One having ordinary skill in the art will readily understand which steps and processes would be omitted or repeated.

Although the RDL routing design described herein is discussed with respect to the front-side redistribution structure 160, the teachings of the RDL routing process may also be applied to the back-side redistribution structure 110.

Figure 19:
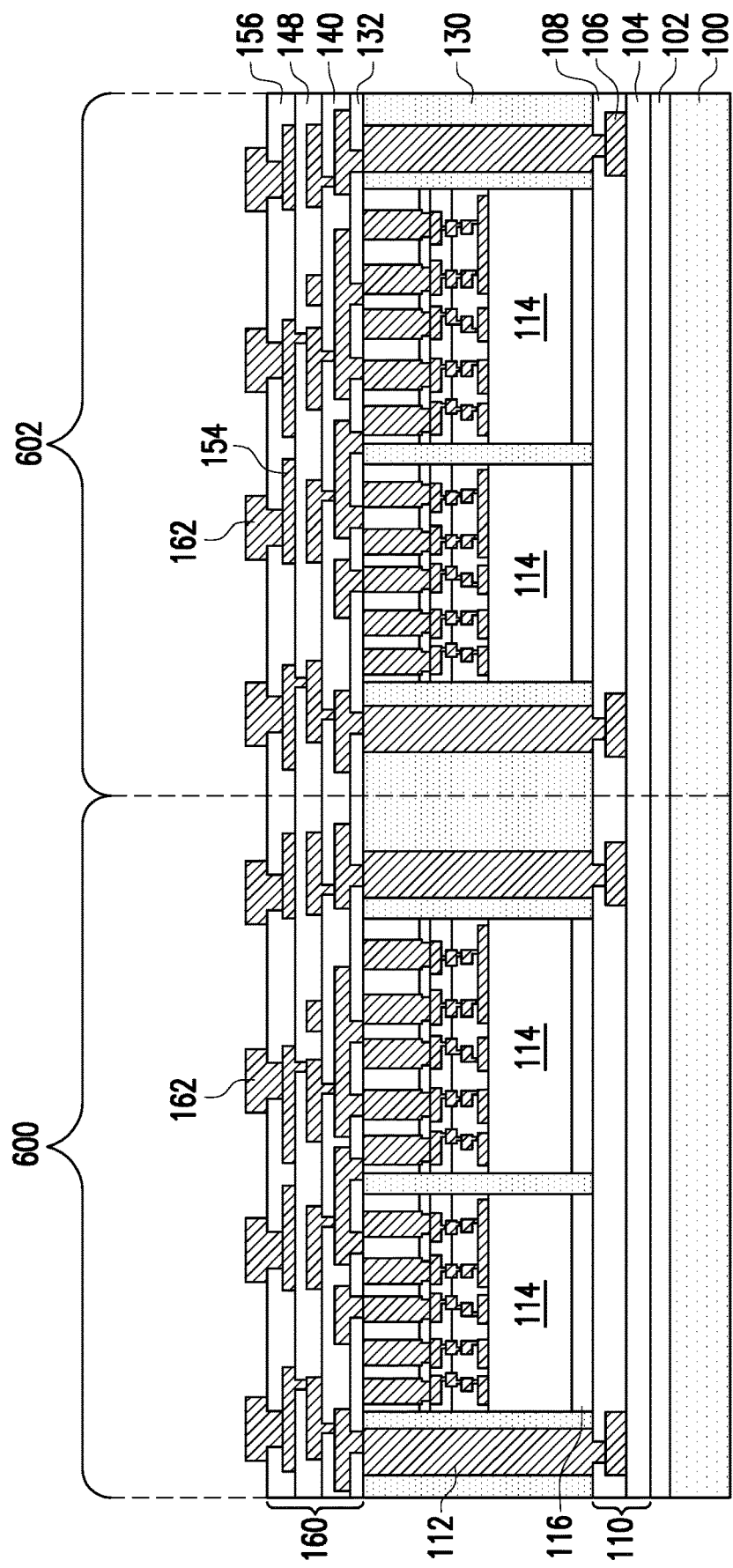

In FIG. 19, pads 162 are formed on an exterior side of the front-side redistribution structure 160. The pads 162 are used to couple to conductive connectors 166 (see FIG. 20) and may be referred to as under bump metallurgies (UBMs) 162. In the illustrated embodiment, the pads 162 are formed through openings through the dielectric layer 156 to the metallization pattern 154. As an example to form the pads 162, a seed layer (not shown) is formed over the dielectric layer 156. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the pads 162. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the pads 162. In the embodiment, where the pads 162 are formed differently, more photo resist and patterning steps may be utilized.

Figure 20:
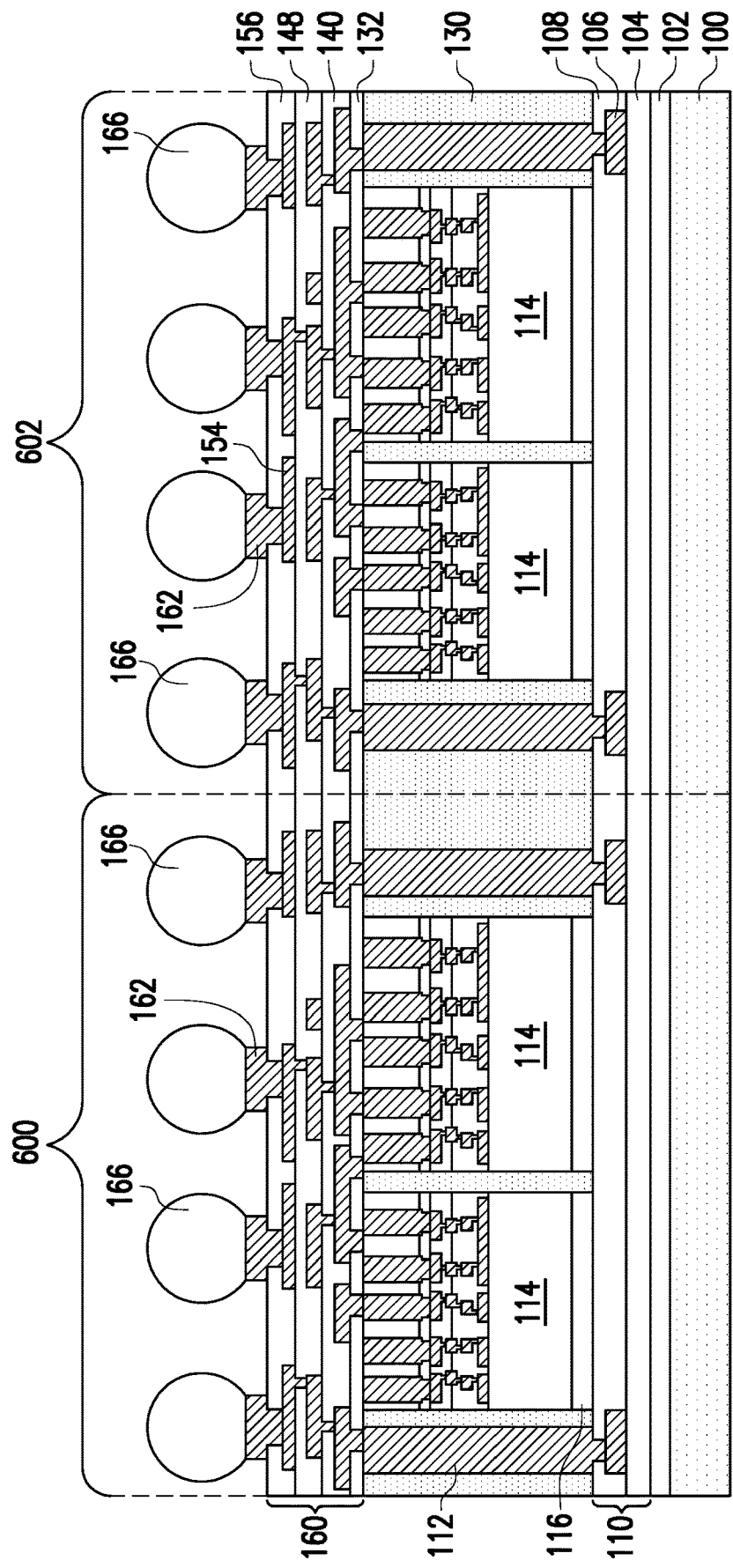

In FIG. 20, conductive connectors 166 are formed on the UBMs 162. The conductive connectors 166 may be BGA connectors, solder balls, metal pillars, controlled collapse chip connection (C4) bumps, micro bumps, electroless nickel-electroless palladium-immersion gold technique (ENEPIG) formed bumps, or the like. The conductive connectors 166 may include a conductive material such as solder, copper, aluminum, gold, nickel, silver, palladium, tin, the like, or a combination thereof. In some embodiments, the conductive connectors 166 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 166 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the metal pillar connectors 166. The metal cap layer may include nickel, tin, tin-lead, gold, silver, palladium, indium, nickel-palladium-gold, nickel-gold, the like, or a combination thereof and may be formed by a plating process.

Figure 21:
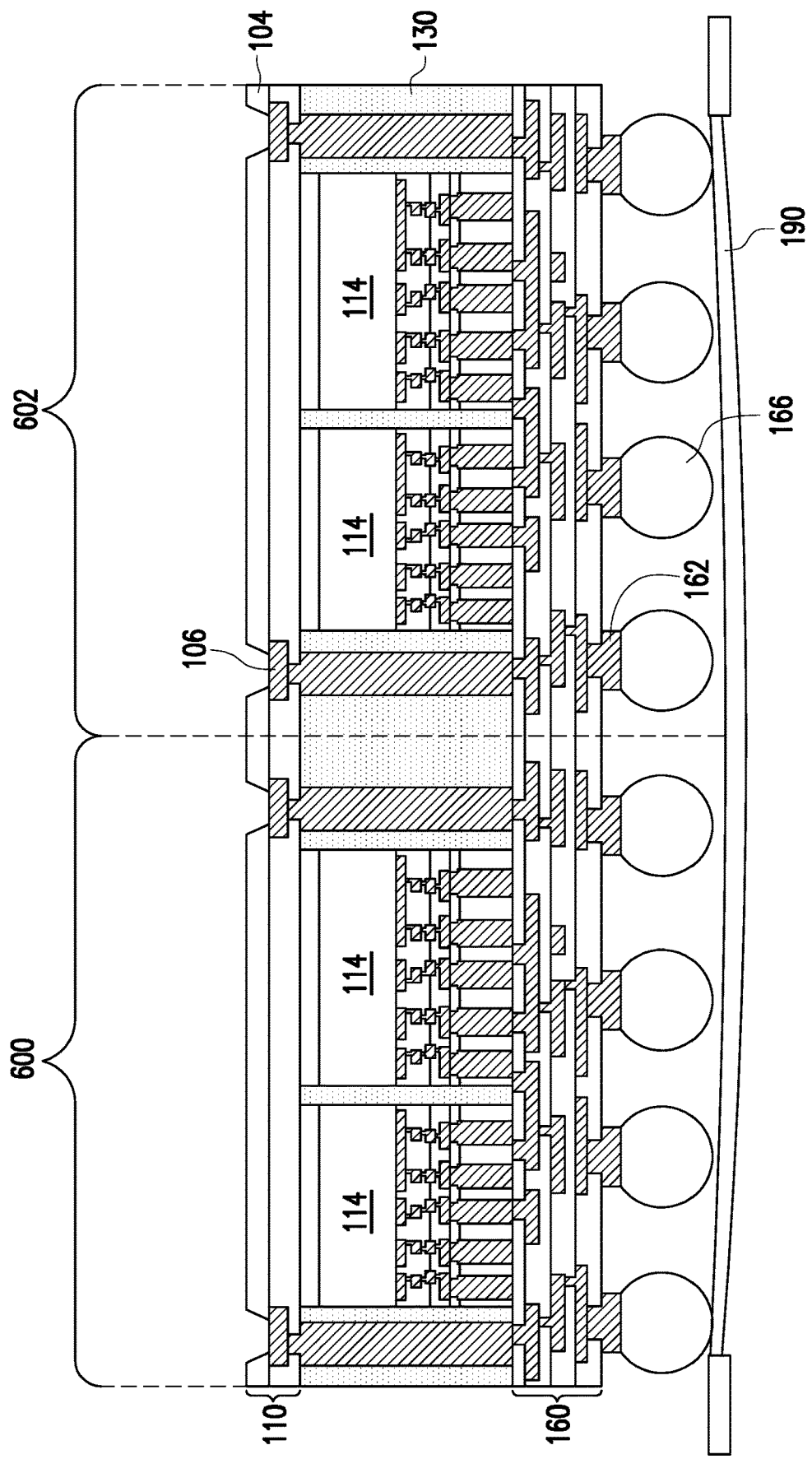

In FIG. 21, a carrier substrate de-bonding is performed to detach (de-bond) the carrier substrate 100 from the backside redistribution structure, e.g., dielectric layer 104. In accordance with some embodiments, the de-bonding includes projecting a light such as a laser light or an UV light on the release layer 102 so that the release layer 102 decomposes under the heat of the light and the carrier substrate 100 can be removed. The structure is then flipped over and placed on a tape 190.

As further illustrated in FIG. 21, openings are formed through the dielectric layer 104 to expose portions of the metallization pattern 106. The openings may be formed, for example, using laser drilling, etching, or the like.

Figure 22:
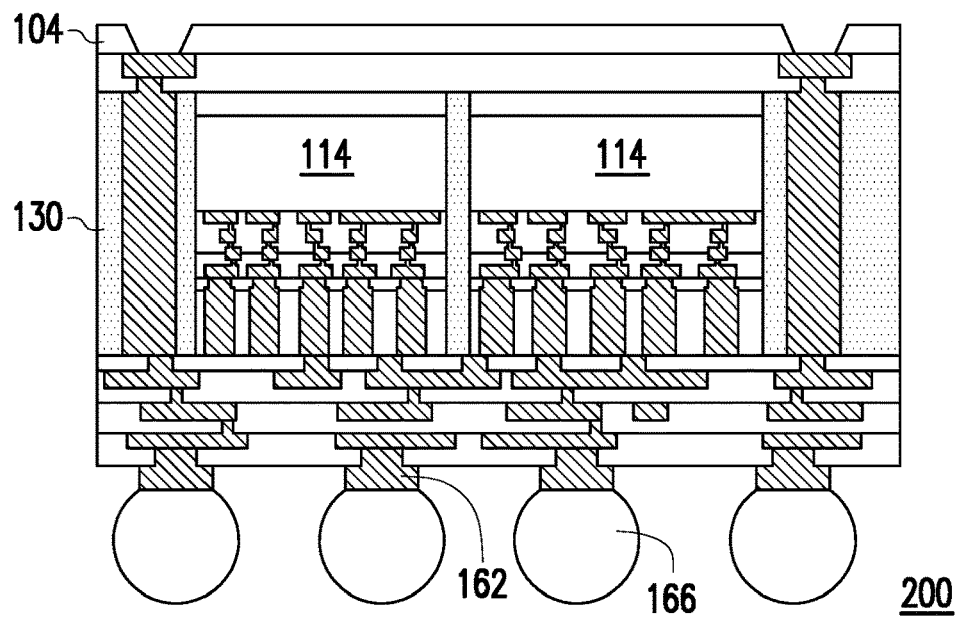

In FIG. 22, a singulation process is performed by sawing along scribe line regions e.g., between adjacent regions 600 and 602. The sawing singulates the first package region 600 from the second package region 602.

FIG. 22 illustrates a resulting, singulated package 200, which may be from one of the first package region 600 or the second package region 602. The package 200 may also be referred to as an integrated fan-out (InFO) package 200.

Figure 23:
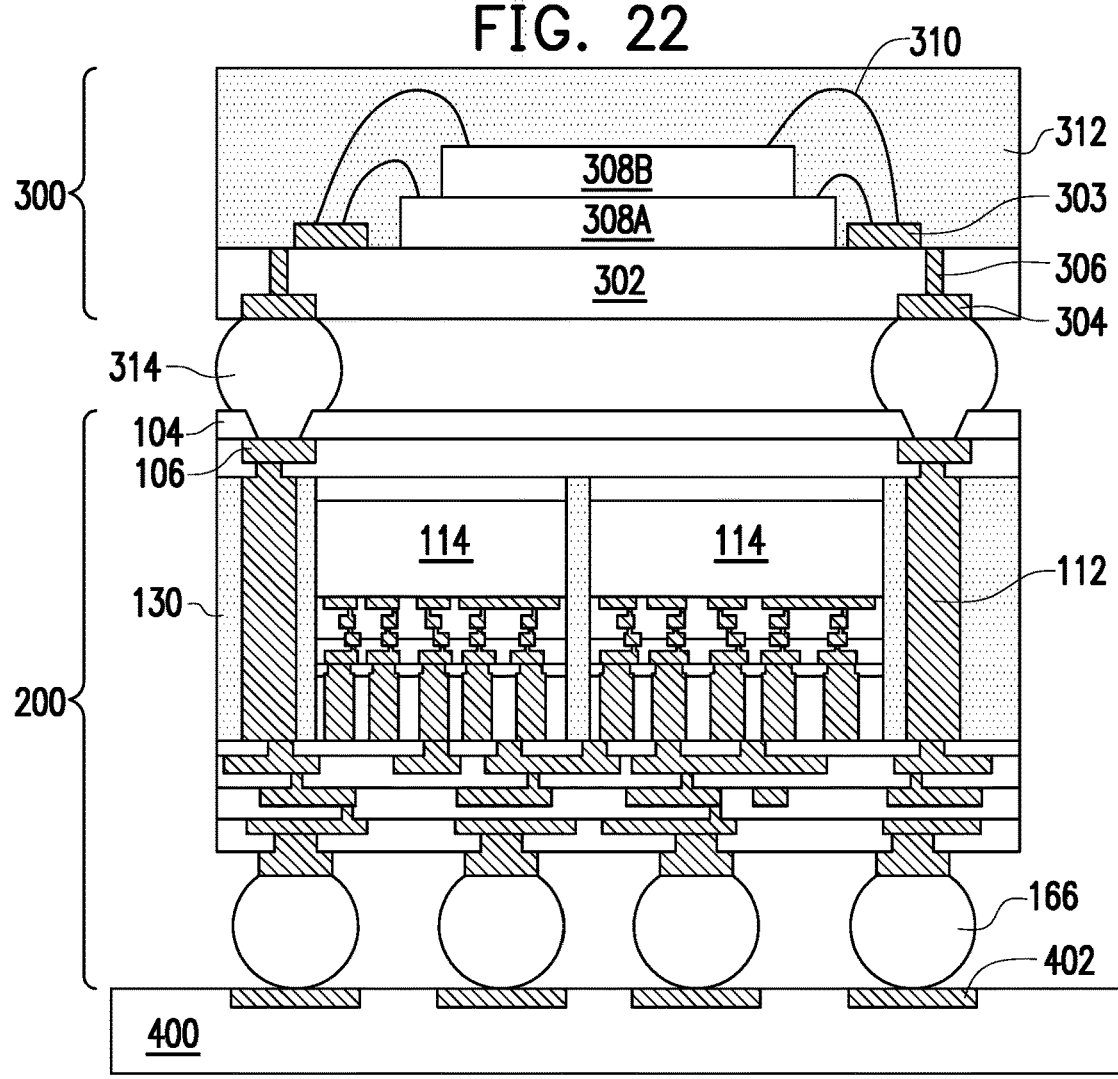

FIG. 23 illustrates a package structure 500 including the package 200 (may be referred to as a first package 200), a second package 300, and a substrate 400. The second package 300 includes a substrate 302 and one or more stacked dies 308 (308A and 308B) coupled to the substrate 302. The substrate 302 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 302 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 302 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 302.

The substrate 302 may include active and passive devices (not shown in FIG. 28). As one of ordinary skill in the art will recognize, a wide variety of devices such as transistors, capacitors, resistors, combinations of these, and the like may be used to generate the structural and functional requirements of the design for the semiconductor package 300. The devices may be formed using any suitable methods.

The substrate 302 may also include metallization layers (not shown) and through vias 306. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 302 is substantially free of active and passive devices.

The substrate 302 may have bond pads 303 on a first side the substrate 202 to couple to the stacked dies 308, and bond pads 304 on a second side of the substrate 302, the second side being opposite the first side of the substrate 302, to couple to the conductive connectors 314. In some embodiments, the bond pads 303 and 304 are formed by forming recesses (not shown) into dielectric layers (not shown) on the first and second sides of the substrate 302. The recesses may be formed to allow the bond pads 303 and 304 to be embedded into the dielectric layers. In other embodiments, the recesses are omitted as the bond pads 303 and 304 may be formed on the dielectric layer. In some embodiments, the bond pads 303 and 304 include a thin seed layer (not shown) made of copper, titanium, nickel, gold, palladium, the like, or a combination thereof. The conductive material of the bond pads 303 and 304 may be deposited over the thin seed layer. The conductive material may be formed by an electrochemical plating process, an electroless plating process, CVD, ALD, PVD, the like, or a combination thereof. In an embodiment, the conductive material of the bond pads 303 and 304 is copper, tungsten, aluminum, silver, gold, the like, or a combination thereof.

In an embodiment, the bond pads 303 and 304 are UBMs that include three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs 303 and 304. Any suitable materials or layers of material that may be used for the UBMs 303 and 304 are fully intended to be included within the scope of the current application. In some embodiments, the through vias 306 extend through the substrate 302 and couple at least one bond pad 303 to at least one bond pad 304.

In the illustrated embodiment, the stacked dies 308 are coupled to the substrate 302 by wire bonds 310, although other connections may be used, such as conductive bumps. In an embodiment, the stacked dies 308 are stacked memory dies. For example, the stacked memory dies 308 may include low-power (LP) double data rate (DDR) memory modules, such as LPDDR1, LPDDR2, LPDDR3, LPDDR4, or the like memory modules.

In some embodiments, the stacked dies 308 and the wire bonds 310 may be encapsulated by a molding material 312. The molding material 312 may be molded on the stacked dies 308 and the wire bonds 310, for example, using compression molding. In some embodiments, the molding material 312 is a molding compound, a polymer, an epoxy, silicon oxide filler material, the like, or a combination thereof. A curing step may be performed to cure the molding material 312, wherein the curing may be a thermal curing, a UV curing, the like, or a combination thereof.

In some embodiments, the stacked dies 308 and the wire bonds 310 are buried in the molding material 312, and after the curing of the molding material 312, a planarization step, such as a grinding, is performed to remove excess portions of the molding material 312 and provide a substantially planar surface for the second packages 300.

After the second packages 300 are formed, the packages 300 are bonded to the first packages 200 by way of conductive connectors 314, the bond pads 304, and the metallization pattern 106. In some embodiments, the stacked memory dies 308 may be coupled to the integrated circuit dies 114 through the wire bonds 310, the bond pads 303 and 304, through vias 306, the conductive connectors 314, and the through vias 112.

The conductive connectors 314 may be similar to the conductive connectors 166 described above and the description is not repeated herein, although the conductive connectors 314 and 166 need not be the same. In some embodiments, before bonding the conductive connectors 314, the conductive connectors 314 are coated with a flux (not shown), such as a no-clean flux. The conductive connectors 314 may be dipped in the flux or the flux may be jetted onto the conductive connectors 314. In another embodiment, the flux may be applied to the surfaces of the metallization patterns 106.

In some embodiments, the conductive connectors 314 may have an epoxy flux (not shown) formed thereon before they are reflowed with at least some of the epoxy portion of the epoxy flux remaining after the second package 300 is attached to the first package 200. This remaining epoxy portion may act as an underfill to reduce stress and protect the joints resulting from the reflowing the conductive connectors 314. In some embodiments, an underfill (not shown) may be formed between the second package 300 and the first package 200 and surrounding the conductive connectors 314. The underfill may be formed by a capillary flow process after the second package 300 is attached or may be formed by a suitable deposition method before the second package 300 is attached.

The bonding between the second package 300 and the first package 200 may be a solder bonding or a direct metal-to-metal (such as a copper-to-copper or tin-to-tin) bonding. In an embodiment, the second package 300 is bonded to the first package 200 by a reflow process. During this reflow process, the conductive connectors 314 are in contact with the bond pads 304 and the metallization patterns 106 to physically and electrically couple the second package 300 to the first package 200. After the bonding process, an IMC (not shown) may form at the interface of the metallization patterns 106 and the conductive connectors 314 and also at the interface between the conductive connectors 314 and the bond pads 304 (not shown).

The semiconductor package 500 includes the packages 200 and 300 being mounted to a substrate 400. The substrate 400 may be referred to a package substrate 400. The package 200 is mounted to the package substrate 400 using the conductive connectors 166.

The package substrate 400 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 400 may be a SOI substrate. Generally, an SOI substrate includes a layer of a semiconductor material such as epitaxial silicon, germanium, silicon germanium, SOI, SGOI, or combinations thereof. The package substrate 400 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for package substrate 400.

The package substrate 400 may include active and passive devices (not shown in FIG. 23). As one of ordinary skill in the art will recognize, a wide variety of devices such as transistors, capacitors, resistors, combinations of these, and the like may be used to generate the structural and functional requirements of the design for the semiconductor package 500. The devices may be formed using any suitable methods.

The package substrate 400 may also include metallization layers and vias (not shown) and bond pads 402 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 400 is substantially free of active and passive devices.

In some embodiments, the conductive connectors 166 can be reflowed to attach the package 200 to the bond pads 402. The conductive connectors 166 electrically and/or physically couple the substrate 400, including metallization layers in the substrate 400, to the first package 200.

The conductive connectors 166 may have an epoxy flux (not shown) formed thereon before they are reflowed with at least some of the epoxy portion of the epoxy flux remaining after the package 200 is attached to the substrate 400. This remaining epoxy portion may act as an underfill to reduce stress and protect the joints resulting from the reflowing the conductive connectors 166. In some embodiments, an underfill (not shown) may be formed between the first package 200 and the substrate 400 and surrounding the conductive connectors 166. The underfill may be formed by a capillary flow process after the package 200 is attached or may be formed by a suitable deposition method before the package 200 is attached.

Embodiments of the device and methods in the current disclosure have many advantages. In particular, a redistribution layer (RDL) routing design that enables more reliability robustness at a semiconductor-encapsulant boundary (e.g. a silicon/molding compound (Si/MC) boundary). For example, heating a package up in wafer form from room temperature to 220° C. results in high bending stresses on the RDL at the semiconductor-encapsulant boundary due to the curvature changing drastically because of CTE mismatch. The stress of transferring from fan-in to fan-out area can cause the RDL cracking, at the die corner and die sides. Hence, in some embodiments, the RDL routing design (see FIGS. 16 and 17) can be used for reliability robustness.

In accordance with an embodiment, a package includes a first integrated circuit die, an encapsulant around the first integrated circuit die, and a conductive line electrically connecting a first conductive via to a second conductive via. The conductive line includes a first segment over the first integrated circuit die and having a first lengthwise dimension extending in a first direction and a second segment having a second lengthwise dimension extending in a second direction different than the first direction. The second segment extends over a boundary between the first integrated circuit die and the encapsulant.

In accordance with another embodiment, a device includes a first integrated circuit die, a second and an encapsulant around the first integrated circuit die. Sidewalls of the first integrated circuit die and the encapsulant define a first boundary. The device further includes a plurality of through-vias extending through the encapsulant and electrically connected to the first integrated circuit die and redistribution layers over the first integrated circuit die and the encapsulant. A conductive line in the redistribution layers connects a first conductive via over the first integrated circuit die to a second conductive via. The conductive line includes a first bend between the first conductive via and the first boundary in a plan-view of the device and a second bend between the first boundary and the second conductive via in the plan-view of the device.

In accordance with another embodiment, a device includes a first integrated circuit die, a second integrated circuit die, and an encapsulant disposed between the first integrated circuit die and the second integrated circuit die. The device further includes a plurality of through-vias extending through the encapsulant and electrically connected to the first integrated circuit die, the second integrated circuit die, and redistribution layers over the first integrated circuit die and the encapsulant. A conductive line in the redistribution layers connects a first conductive via over the first integrated circuit die to a second conductive via over the second integrated circuit die. The conductive line includes a first segment over the first integrated circuit die, a second segment disposed at a different angle than the first segment in a plan view of the device, and a third segment over the second integrated circuit die and disposed at a different angle than the second segment in the plan view of the device. The second segment extends over a first interface between the first integrated circuit die and the encapsulant.

In accordance with yet another embodiment, a method includes encapsulating a first integrated circuit die in an encapsulant and forming redistribution layers (RDLs) over the first integrated circuit die and the encapsulant. The RDLs include a first conductive via over the first integrated circuit die and a conductive line electrically connecting the first conductive via to a second conductive via. The conductive line includes a first segment over the first integrated circuit die and extending along a first direction, a second segment extending over a boundary between the first integrated circuit die and the encapsulant in a second direction different than the first direction, and a third segment extending along a third direction different than the second direction. The second segment is disposed between the first segment and the third segment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
a first semiconductor die surrounded by a molding compound, wherein the molding compound forms a first interface with the first semiconductor die;
a conductive line in a redistribution structure over the first semiconductor die and the molding compound, wherein the conductive line electrically connects the first semiconductor die to a first conductive via, wherein the first conductive via overlaps the molding compound, wherein the conductive line extends across the first interface, and wherein the conductive line comprises:
a first portion overlapping the first semiconductor die, wherein the first portion comprises a first bend; and
a second portion overlapping the molding compound, wherein the second portion comprises a second bend.

2. The package of claim 1, wherein the second portion of the conductive line overlapping the molding compound further comprises a third bend.

3. The package of claim 1, wherein a first angle of the first bend is in a range of 120° to 150°.

4. The package of claim 3, wherein a second angle of the second bend is in a range of 120° to 150°.

5. The package of claim 4, wherein the second angle is equal to the first angle.

6. The package of claim 1 further comprising:
forming a first polymer layer over the first semiconductor die and the molding compound;
forming second conductive via extending through the first polymer layer to a die connector of the first semiconductor die, wherein the conductive line is disposed over the first polymer layer; and
forming a second polymer layer over the conductive line, wherein the first conductive via extends through the second polymer layer.

7. A package comprising:
a first semiconductor die surrounded by a molding compound; and
a first metal line electrically connecting a first conductive via in an area directly over the first semiconductor die to a second conductive via, the second conductive via is outside of the area directly over the first semiconductor die, wherein the first metal line comprises:
a first bend in the area directly over the first semiconductor die;
a second bend and a third bend outside of the area directly over the first semiconductor die; and
a first linear segment between the first bend and the second bend, the first linear segment extending across a boundary between the first semiconductor die and the molding compound.

8. The package of claim 7, wherein the first metal line further comprises a fourth bend.

9. The package of claim 8, wherein the first metal line further comprises a second linear segment between the second bend and the third bend, wherein the second linear segment overlaps the molding compound.

10. The package of claim 9, wherein the first metal line further comprises a third linear segment connected to and extending in a different direction than the second linear segment.

11. The package of claim 7, wherein a first angle of the first bend is in a range of 120° to 150°, wherein a second angle of the second bend is in a range of 120° to 150°, and wherein a third angle of the third bend is in a range of 120° to 150°.

12. The package of claim 11, wherein the first angle of the first bend is equal to the second angle of the second bend and the third angle of the third bend.

13. The package of claim 7, wherein the second conductive via electrically connects the first metal line to a second metal line over the first metal line.

14. A package comprising:
  a first semiconductor die encapsulated by a molding compound, wherein the first semiconductor die meets the molding compound at a first boundary; and
  a metal line electrically connecting a first conductive via over the first semiconductor die to a second conductive via, the second conductive via overlaps the molding compound, wherein in a plan view, the metal line changes directions at least once between the first conductive via and the first boundary.

15. The package of claim 14, wherein in the plan view, the metal line changes direction at least once between the second conductive via and the first boundary.

16. The package of claim 14, wherein in the plan view, the metal line changes direction at least twice between the second conductive via and the first boundary.

17. The package of claim 14, wherein metal line comprises:
  a first linear segment;
  a second linear segment; and
  a third linear segment between the first linear segment and the second linear segment, wherein the third linear segment extends in a different direction than the first linear segment and the second linear segment.

18. The package of claim 17, wherein the first linear segment extends in a first direction that is parallel to a second direction in which the second linear segment extends.

19. The package of claim 17, wherein the first linear segment extends across the first boundary.

20. The package of claim 14, wherein the second conductive via is disposed over the metal line, and wherein the first conductive via is disposed under the metal line.

* * * * *